US012442712B2

(12) United States Patent
Subrahmanyam et al.

(10) Patent No.: US 12,442,712 B2
(45) Date of Patent: Oct. 14, 2025

(54) LIQUID COOLING SYSTEM LEAK DETECTION IMPROVEMENTS

(71) Applicant: Intel Corporation, Santa Clara, CA (US)

(72) Inventors: Prabhakar Subrahmanyam, San Jose, CA (US); Yi Xia, Campbell, CA (US); Ying-Feng Pang, San Jose, CA (US); Victor Polyanko, Kent, WA (US); Mark Bianco, Redwood City, CA (US); Bijoyraj Sahu, Portland, OR (US); Minh T. D. Le, North Plains, OR (US); Carlos Alvizo Flores, Guadalajara (MX); Javier Avalos Garcia, Zapopan (MX); Adriana Lopez Iniguez, Jalisco (MX); Luz Karine Sandoval Granados, Zapopan (MX); Michael Berktold, Phoenix, AZ (US); Damion Searls, Portland, OR (US); Jin Yang, Hillsboro, OR (US); David Shia, Portland, OR (US); Samer Melhem, Tualatin, OR (US); Jeffrey Ryan Conner, Beaverton, OR (US); Hemant Desai, Gilbert, AZ (US); John Raatz, Chandler, AZ (US); Richard Dischler, Bolton, ME (US); Bergen Anderson, Santa Clara, CA (US); Eric W. Buddrius, Hillsboro, OR (US); Kenan Arik, Hillsboro, OR (US); Barrett M. Faneuf, Beaverton, OR (US); Lianchang Du, Kunshan (CN); Yuehong Fan, Shanghai (CN); Shengzhen Zhang, Shanghai (CN); Yuyang Xia, Shanghai (CN); Jun Zhang, Shanghai (CN); Yuan Li, Shanghai (CN); Catharina Biber, Portland, OR (US); Kristin L. Weldon, Hillsboro, OR (US); Brendan T. Pavelek, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 846 days.

(21) Appl. No.: 17/133,554

(22) Filed: Dec. 23, 2020

(65) Prior Publication Data
US 2022/0196507 A1    Jun. 23, 2022

(51) Int. Cl.
*G01M 3/04* (2006.01)
*G01M 3/16* (2006.01)
(Continued)

(52) U.S. Cl.
CPC .............. *G01M 3/04* (2013.01); *G01M 3/165* (2013.01); *G01M 3/20* (2013.01); *H05K 7/20736* (2013.01); *H05K 7/20772* (2013.01)

(58) Field of Classification Search
CPC .......... G01M 3/04; G01M 3/165; G01M 3/20; H05K 7/20736; H05K 7/20772
See application file for complete search history.

(56) References Cited

U.S. PATENT DOCUMENTS 3,659,453 A * 5/1972 Martin, Jr. .......... G01M 3/2807
73/40
5,090,871 A * 2/1992 Story ...................... G01M 3/38
417/63

(Continued)

FOREIGN PATENT DOCUMENTS

| GB | 2576032 | 4/2021 |
|----|---------|--------|
| GB | 2576030 | 12/2021 |

(Continued)

OTHER PUBLICATIONS

DuPont, "Introducing Nomex® Comfort," Jan. 8, 2020, retrieved from [https://www.dupont.com/knowledge/introducing-nomex-comfort.html] on Oct. 7, 2022, 3 pages.

(Continued)

*Primary Examiner* — Eric S. McCall
(74) *Attorney, Agent, or Firm* — Hanley, Flight & Zimmerman, LLC

(57) ABSTRACT

An apparatus is described. The apparatus includes a cover to enclose a junction between respective ends of first and second fluidic conduits. The first and second fluidic conduits transport a coolant fluid within an electronic system. The apparatus also includes a leak detection device to be located within a region that is enclosed by the cover when the junction is enclosed by the cover. The leak detection device is to detect a leak of the coolant fluid at the junction when the junction is enclosed by the cover. The first and second fluidic conduits extend outside the cover when the junction is enclosed by the cover. Another apparatus is also described. The other apparatus includes a leak detection device to detect a leak of coolant fluid from a specific component or junction in a liquid cooling system of an electronic system.

15 Claims, 38 Drawing Sheets

(51) Int. Cl.
*G01M 3/20* (2006.01)
*H05K 7/20* (2006.01)

(56) References Cited

U.S. PATENT DOCUMENTS

| | | | | |
|---|---|---|---|---|
| 5,966,076 | A * | 10/1999 | Cantrell | G01M 3/18 251/74 |
| 8,590,559 | B1 * | 11/2013 | Gutierrez | G01M 3/16 200/61.04 |
| 2006/0243050 | A1 * | 11/2006 | Quackenbush | G01N 27/023 73/592 |
| 2007/0169374 | A1 * | 7/2007 | Hamman | H05K 7/20272 34/89 |
| 2008/0129043 | A1 * | 6/2008 | Holt | F28F 9/0253 285/212 |
| 2016/0178475 | A1 * | 6/2016 | Krishnan | H05K 7/20836 324/713 |
| 2017/0181329 | A1 * | 6/2017 | Shelnutt | H05K 7/20781 |
| 2019/0368832 | A1 * | 12/2019 | Huang | G06F 1/20 |
| 2020/0049585 | A1 * | 2/2020 | Mordaunt | G01M 3/2815 |
| 2020/0340767 | A1 * | 10/2020 | Holden | G01M 3/16 |
| 2020/0378858 | A1 * | 12/2020 | Curtis | F17D 5/06 |
| 2021/0088404 | A1 * | 3/2021 | Li | G06F 11/1441 |
| 2021/0116391 | A1 * | 4/2021 | Subrahmanyam | G01M 3/38 |
| 2021/0190626 | A1 * | 6/2021 | MacLeod | G01M 3/18 |
| 2021/0320050 | A1 | 10/2021 | Robinson et al. | |
| 2021/0385970 | A1 * | 12/2021 | Su | G01M 3/3263 |

FOREIGN PATENT DOCUMENTS

| | | |
|---|---|---|
| GB | 2597525 | 2/2022 |
| GB | 2601357 | 6/2022 |

OTHER PUBLICATIONS

Carter Industries Inc., "Fire Resistant Fabrics: Different Types and Uses," Jan. 8, 2020, retrieved from [https://carterny.com/fire-resistant-fabrics-different-types-and-uses/] on Oct. 7, 2022, 4 pages.
Kiatkamjornworn, Suda, "Superabsorbent Polymers and Superabsorbent Polymer Composites", Science Asia 33, Supplement 1 (2007) 5 pages.
Scudellari,Megan, "Meet the E-Nose That Actually Sniffs", The Human OS/Biomedical/Biomedical Devices, Oct. 26, 2018, 3 pages.
Shulaker et al., "Three-dimensional integration of nanotechnologies for computing and data storage on a single chip" Nature 547, pp. 74-78, 2017.
Zamor, et al., Water Absorbing Balls: A "Growing" Problem, Pediatrics, vol. 130, No. 4, Oct. 2012.
Trondle et al., "Non-contact optical sensor to detect free flying droplets in the nanolitre range," Sensors and Actuators A: Physical, 158(2), available online Feb. 11, 2010, 254-262., 9 pages, doi: 10.1016/j.sna.2010.01.023, retrievable at http://www.elsevier.com/locate/sna.

* cited by examiner

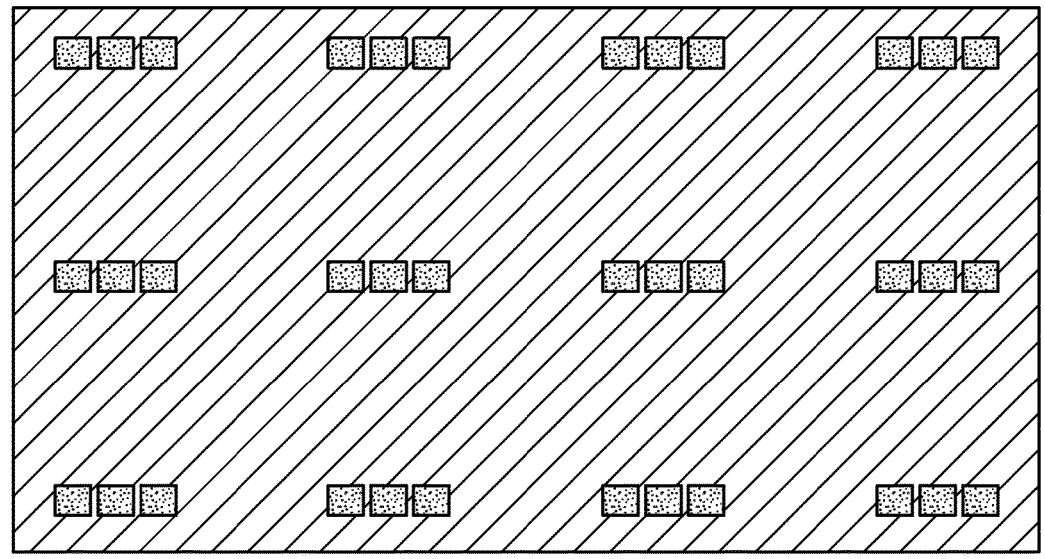
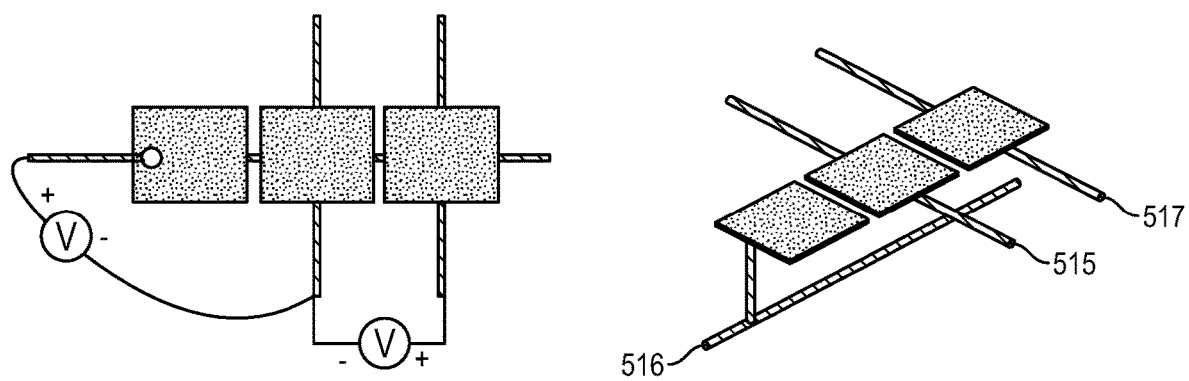
FIG. 5C

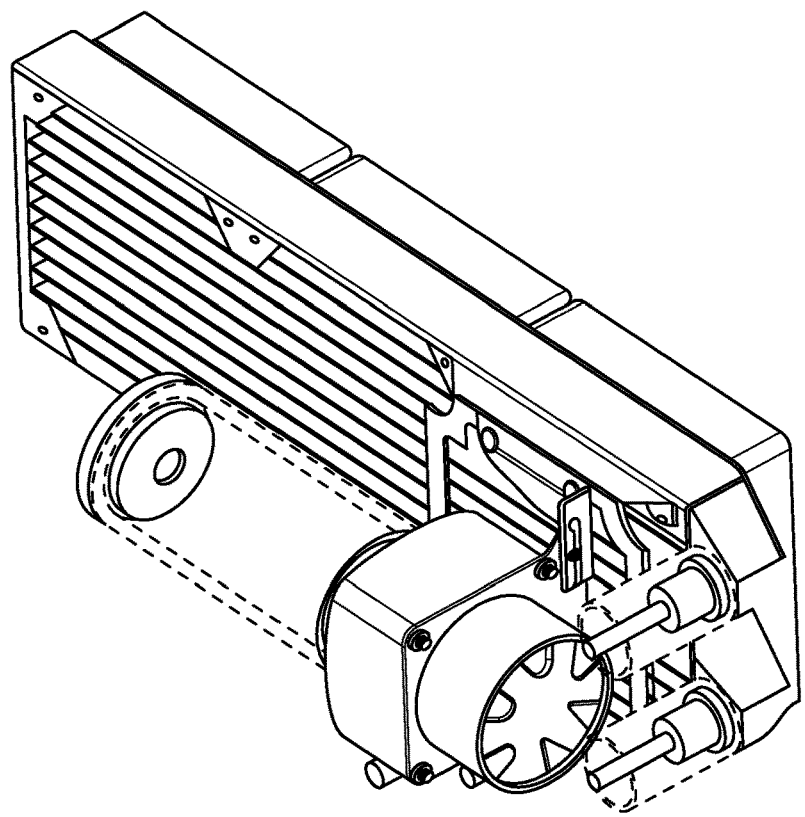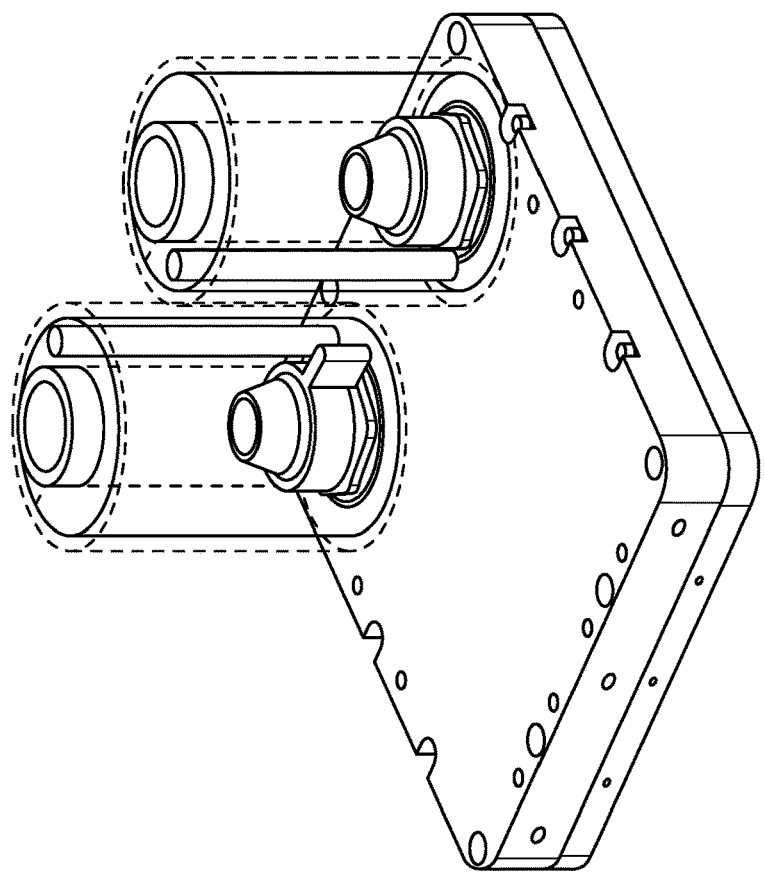
FIG. 6B

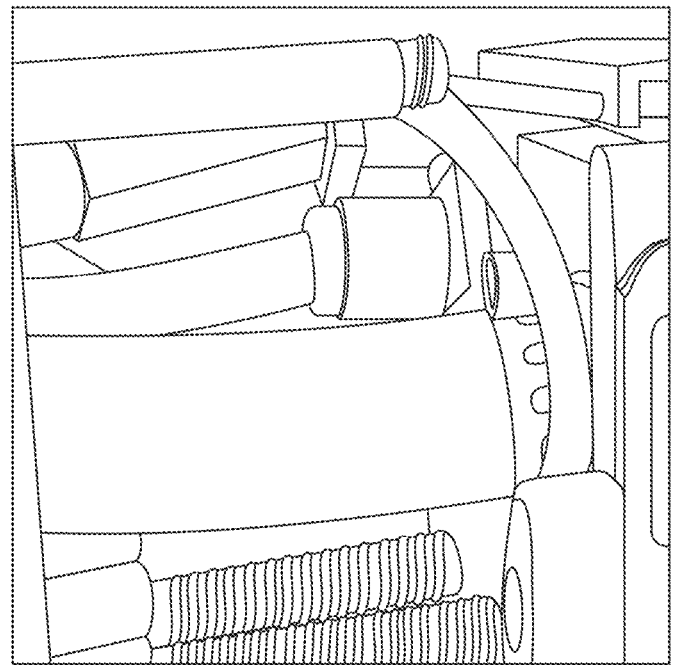
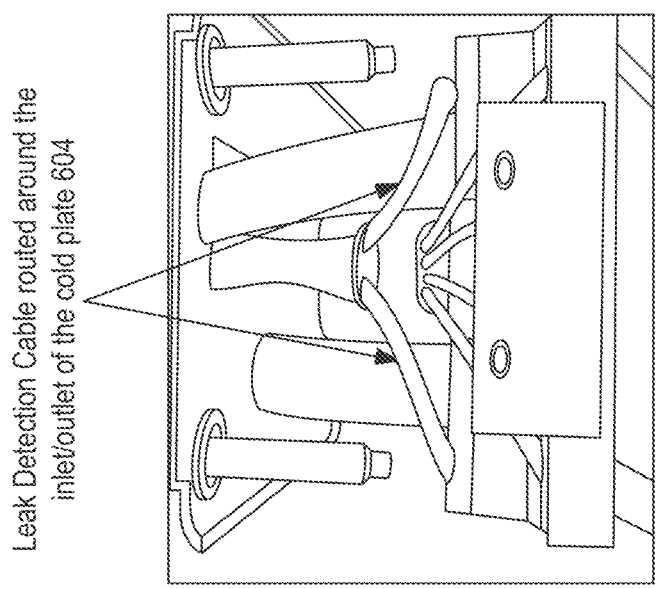
Leak Detection Cable routed around the inlet/outlet of the cold plate 604
FIG. 6C

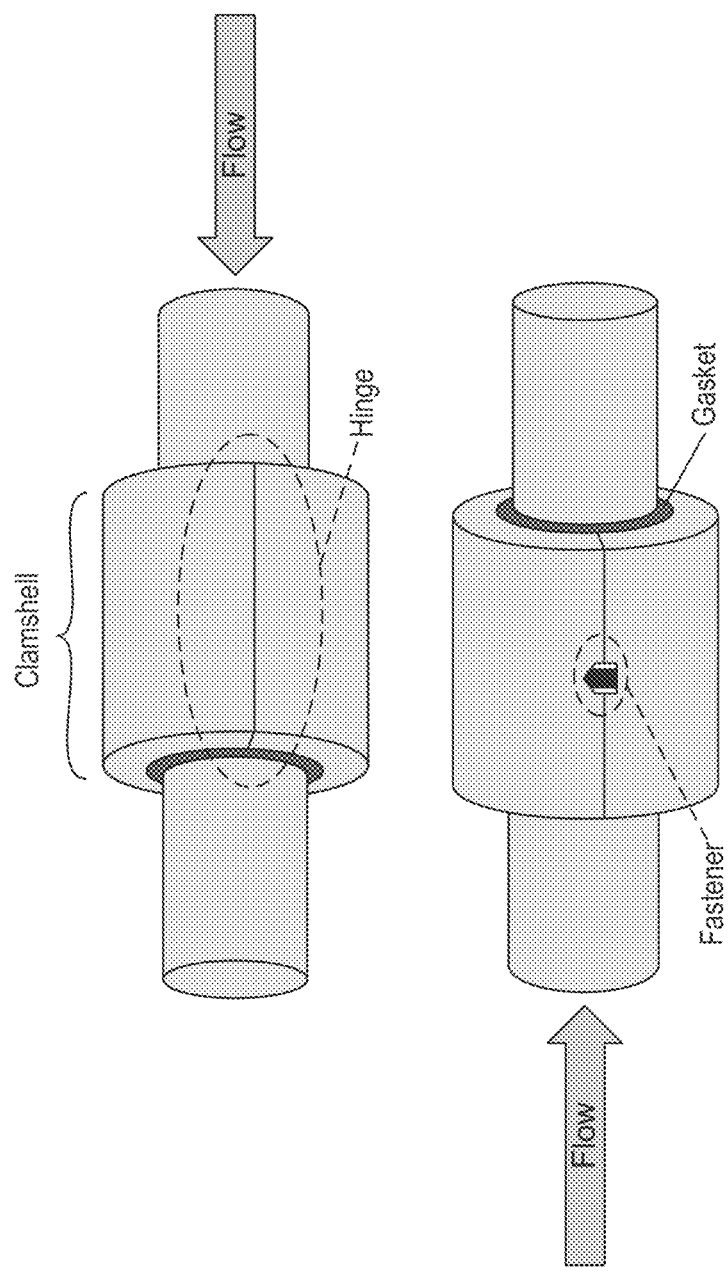

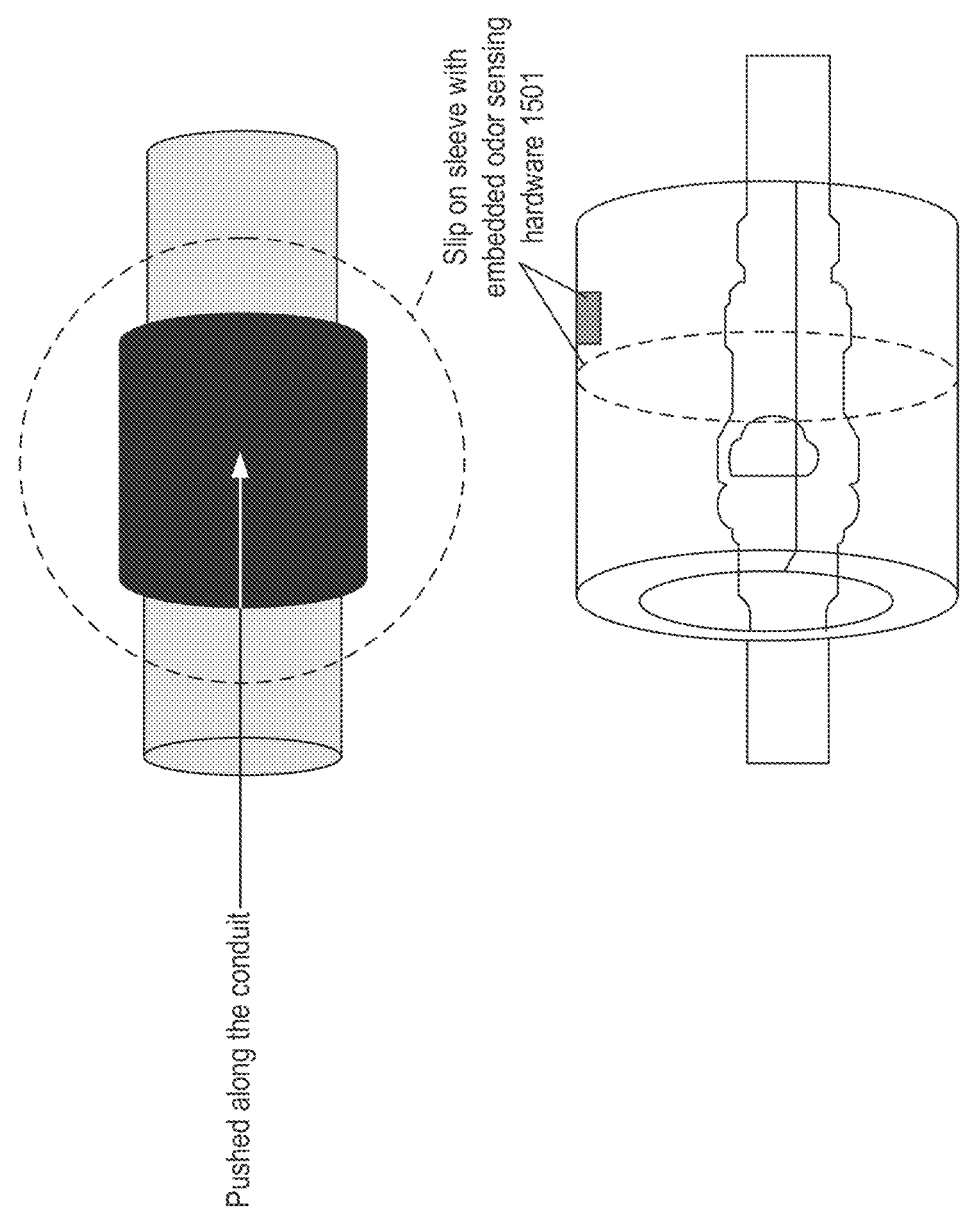

LIQUID COOLING SYSTEM LEAK DETECTION IMPROVEMENTS

BACKGROUND

FIG. 1 shows a high level depiction of a high performance computing environment 100 such as a centralized data center or cloud service nerve center. As observed in FIG. 1, multiple racks 101 each containing shelves of computing equipment are located in a confined area. Generally, information systems (IS) managers desire to pack large amounts of computing performance into small areas. Likewise, semiconductor chip manufacturers and computing equipment manufacturers attempt to densely integrate high performance functionality into their respective products.

As the performance of semiconductor chips (and the computing/networking systems that the chips are integrated into) continues to increase, however, so does the associated power consumption. Unfortunately, the performance of many semiconductor chips and computing/networking system products has crossed a threshold at which traditional air-cooling is unable to keep the chips/equipment sufficiently cool.

As such, liquid cooling solutions are steadily being integrated into today's computing/networking systems. Here, as observed in FIG. 2a, a computing system or networking system ("system"), such as a blade server, a disaggregated computing system CPU unit, a switching hub, etc., includes a number of semiconductor chips 201. The system also includes an inlet 202 to receive cooled fluid. Cold plates 203 are mechanically coupled to various semiconductor chips 201 within the system and the cooled fluid is routed, e.g., by way of one or more manifolds and conduit tubing, through the cold plates 203.

As the semiconductor chips 201 operate they transfer heat to their respective cold plates 203, which, in turn, transfers the heat to the running fluid. The warmed fluid is then collected through one or more manifolds and tubing and routed to a warmed fluid outlet port 204. Note that although FIG. 2a depicts cold plates attached to the semiconductor chips 201, other liquid cooling solutions attach heat exchangers to the semiconductor chips 201. Both cold plates and heat exchangers have fluid input/output junctions as depicted.

As such, referring back to FIG. 1, the racks 101 within a high performance computing environment 100 not only include electrical interfaces and associated wiring to permit their various systems to communicate with other systems, but also, includes fluidic piping/channels to guide cooled/warmed fluids to/from these systems.

The warmed fluid emitted from the systems is drawn away from the racks and directed to a coolant distribution unit (CDU) 102. The CDU 102 acts as a first heat exchanger that receives cooled fluid from a chiller 103 and transfers heat from the fluid received by the racks 101 to the fluid received from the chiller 103. The removal of heat from the fluid received from the racks 101 cools the fluid which is then rerouted back to the racks 101 as cooled fluid. Likewise, the transfer of heat into the fluid received from the chiller 103 warms that fluid which is then routed back to the chiller 103.

The chiller 103 acts as a second heat exchanger that receives cooled fluid from a cooling tower 104. Heat is transferred from the warmed fluid received from the CDU 102 to the fluid received from the cooling tower 104. The removal of heat from the fluid received from the CDU 102 cools the fluid which is then routed back to the CDU 102 as cooled fluid. The transfer of heat warms the fluid received from the cooling tower 104 which is then routed back to the cooling tower 104 for cooling. The cooling tower 104 acts as a third heat exchanger that transfers heat from the fluid it receives to the ambient. This cools the fluid which is then routed back to the chiller 103.

A problem is that leaks can arise in the liquid cooling systems of, e.g., the CDU 102, the racks 101 and/or any of the systems that are plugged into the rack. Here, typically, the liquid coolant is electrically conductive and can cause damage (electrical shorts) if the coolant runs across electrical nodes, connections, wires, etc. As such, detection systems that detect fluid leaks are deemed a pertinent part of a successful transition from air cooled systems to fluid cooled systems.

A current technique for detecting leaks, depicted in FIG. 2b, is a "rope" having exposed wires that are threaded along the run length of the rope. When the rope is dry the exposed wires are isolated from one another by the insulating rope strands. The rope can be laid within an electrical system or rack. If liquid drips or runs onto the rope it will wet the rope which, in turn, will form a short circuit between the exposed wires. Thus, the leak is detected by a change is resistance path between the wires (which generates an alarm). A problem with the rope is that it is generally cumbersome to use. It can be difficult to adequately lay the rope through small form factor or otherwise tight regions of space which limits its ability to be placed in a location where it will come into contact with leaking fluid. Moreover the rope does not provide any specific information as to where the source of the leak is.

BRIEF DESCRIPTION OF THE DRAWINGS

A better understanding of the present invention can be obtained from the following detailed description in conjunction with the following drawings, in which:

FIGS. 5a, 5b and 5c show a touch sensitive chassis floor;

FIGS. 6a and 6b show a clamshell with integrated leak detector;

FIG. 6c shows a liquid detection cable proximate to a cold plate fluidic junction;

FIGS. 15a, 15b and 15c show a clamshell and sleeve with integrated airborne particular detector;

DETAILED DESCRIPTION

Sections 1.0 through 4.0 below describe various improvements over the state of the art. For ease of discussion the sections below generally refer to the attachment of cold plates to semiconductor chips rather than heat exchangers. However, the teachings below can be extended to heat exchanger implementations as well as cold plate implementations.

1.0 Chassis Floor Liquid Detection Devices

A first group of improvements attempts to improve upon the current state of the art, which, as described above, involves the placement of a liquid detection rope that is routed through the chassis of an electronic system (commonly on the floor of the chassis), or along the bottom of a rack, CDU, etc. According to the improvements described herein, leaking coolant fluid is detected in its liquid phase by a structure that is strategically placed, e.g., on a floor or other panel inside the chassis or an electronic system, rack or CDU and detects, in some way, that liquid coolant has come into contact with it.

A first embodiment, depicted in FIGS. 3*a* through 3*e*, involves an inverted chassis architecture with chassis floor, where, the chassis floor is akin to a pan that collects any fluid that drips from an inverted motherboard and channels it to a liquid detection sensor.

Figure 3A:
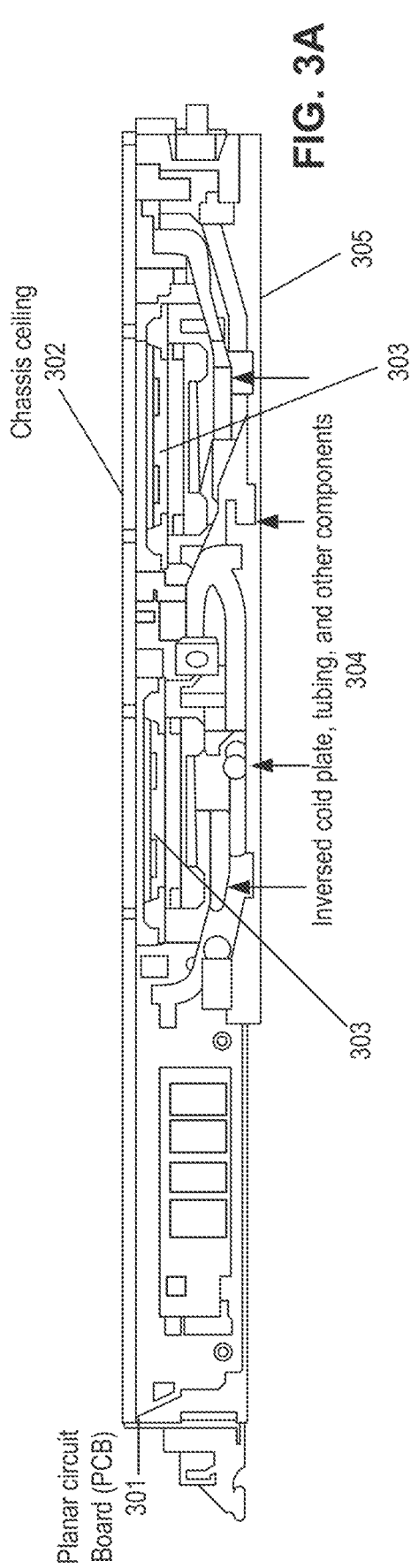
FIGS. 3a, 3b, 3c, 3d and 3e depict a liquid collection chassis floor pan.
Figure 3B:
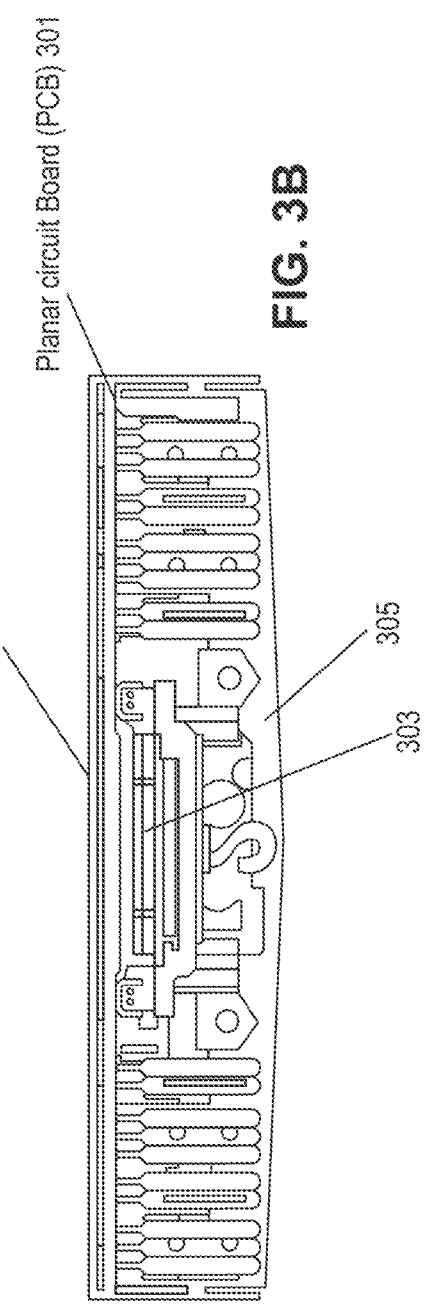

Here, as observed in FIGS. 3*a* and 3*b*, unlike a traditional electronic system in which the primary printed circuit board (PCB) 301 ("motherboard") is mechanically integrated with (and closer to) the chassis floor, by contrast, the motherboard 301 is mechanically integrated with (and closer to) the chassis ceiling 302. As such, the electrical components 303 that are mounted to the primary side of the motherboard, "hang down" from the ceiling 302 within the chassis.

Commonly, an electronic system's most power hungry devices (e.g., ultra large scale integrated logic semiconductor chips such as central processing units (CPUs), graphics processing units (GPUs), accelerators, neural network processors, artificial intelligence processors, memory modules, mass storage modules, etc.) are mounted to the motherboard's primary surface. As such, to the extent there are cold plates mounted to such devices with associated coolant tubing 304, the cold plates and tubing 304 are run along the primary side of the motherboard 301.

With the other side of the motherboard 301 facing the chassis ceiling 302 and being mounted to or otherwise integrated within the chassis close to the chassis ceiling 302, the primary side of the motherboard 301 and its associated cold plates and tubing will hang upside down and face the chassis floor 305. Therefore, if any leaks occur at the cold plates or along the tubing 304, the leak will drip down onto the chassis floor 305.

Importantly, under gravitational force, such drips will naturally run away from the motherboard 301 and its electrical components and features. As such, electrical shorts or other damage that can occur if conductive liquid coolant comes in contact with the motherboard 301 and any of its electrical components/features is avoided (the leaking coolant drips harmlessly into the chassis floor 305). Here, the chassis floor 305 acts as a pan that collects leaking liquid.

Figure 3C:
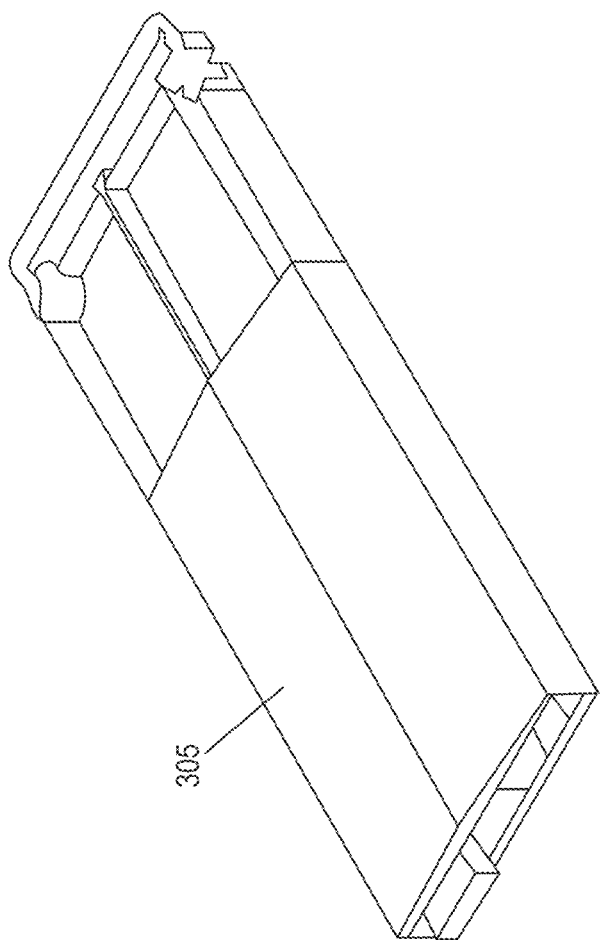
Figure 3D:
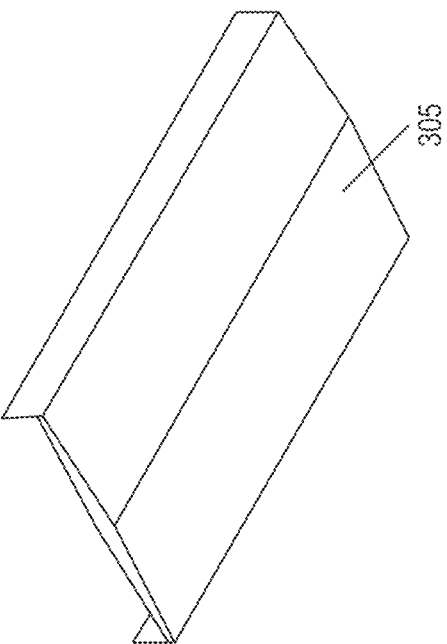
Figure 3E:
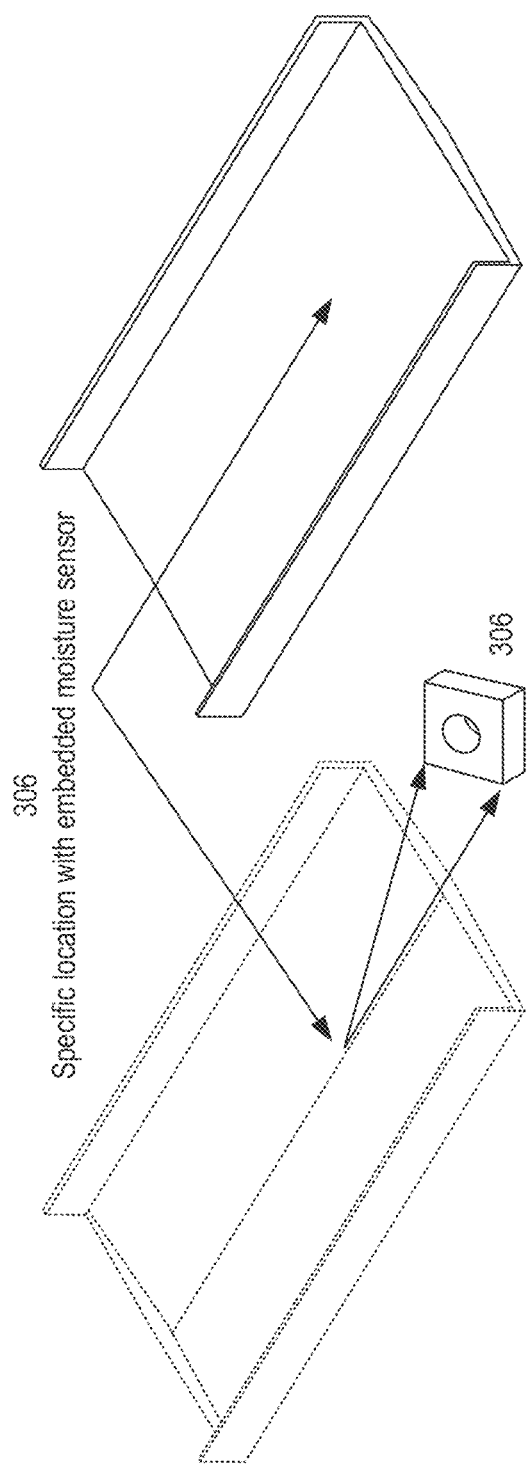

FIG. 3*c* shows an embodiment of the chassis design. The view of FIG. 3*c* shows the chassis in an upside down position so that the viewer can easily see the chassis floor/pan 305. FIG. 3*d* shows an embodiment of the chassis floor/pan 305. As observed in FIG. 3*d* (and FIG. 3*b*), in an embodiment, the floor is angled so that any collected fluid runs to the center of the floor. Likewise, referring to FIG. 3*e*, the floor is angled along its center line so that once fluid is collected at the center, it runs along the pan's center line to a moisture/liquid sensor 306 (hereinafter, liquid sensor).

Thus, any fluid that drips anywhere from the liquid coolant system that is attached to the motherboard 301 will fall somewhere on the floor/pan 305 and then naturally run to the liquid sensor 306 where the liquid is detected. An alarm can then be triggered from the sensor which indicates there is a leak in the chassis.

Figure 4A:
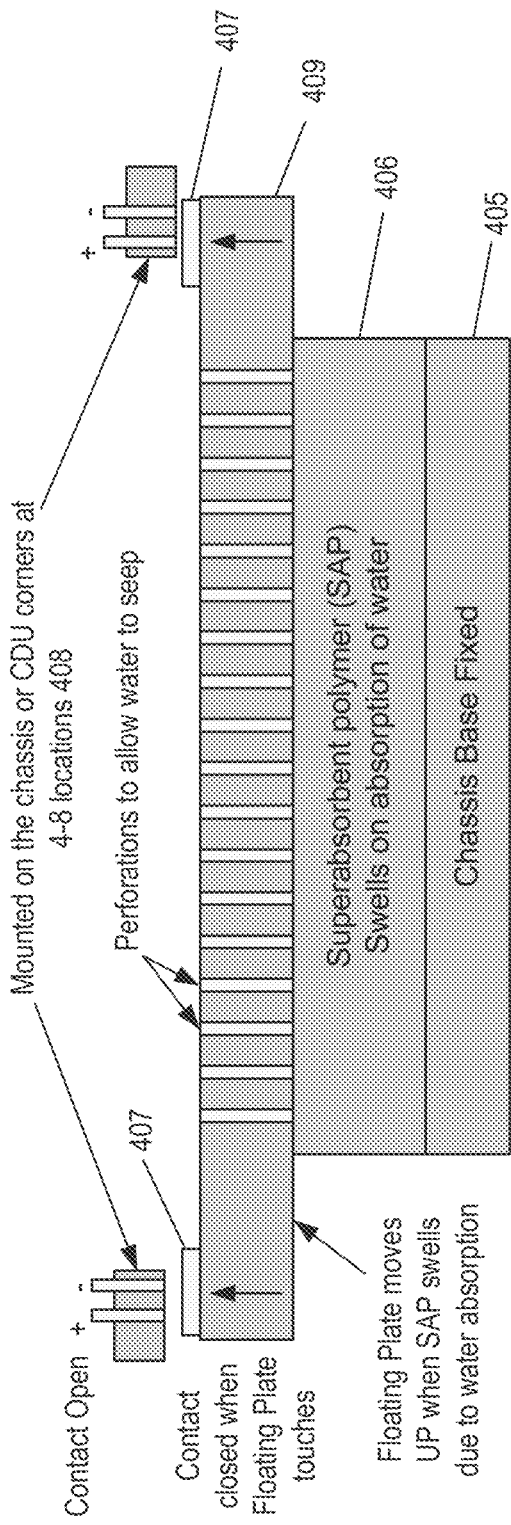
FIGS. 4a and 4b shows an absorbent chassis floor.
Figure 4B:
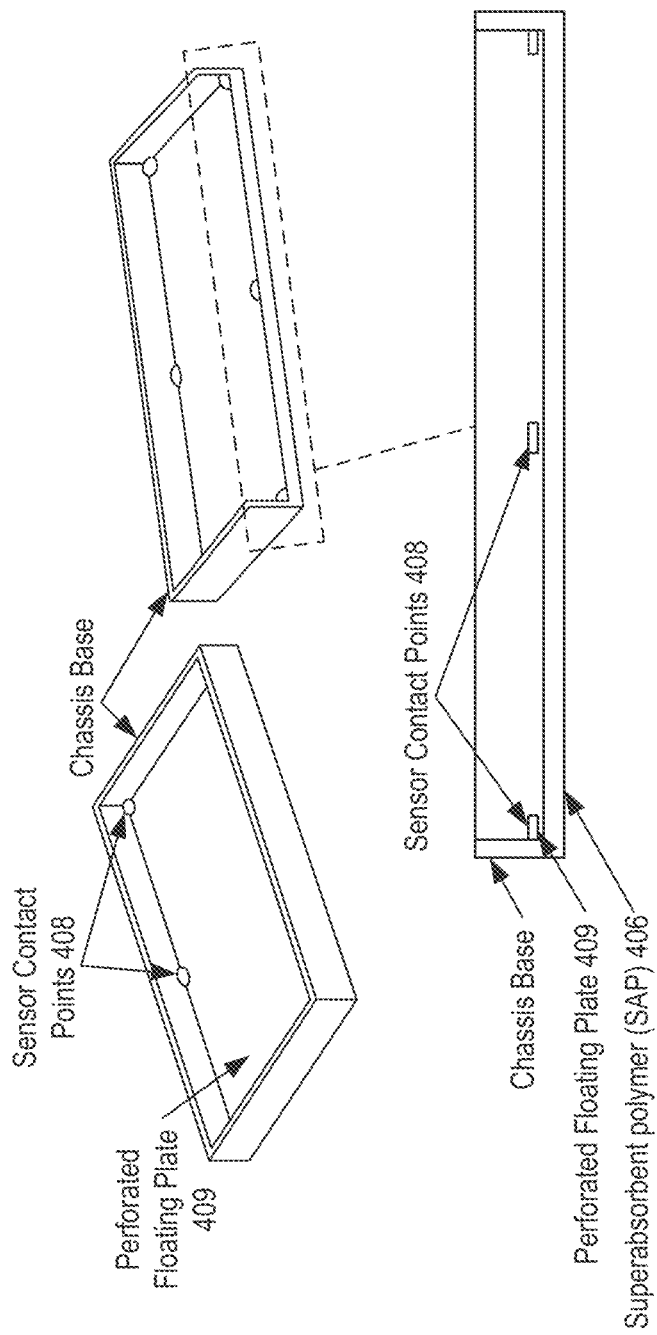

A second embodiment, depicted in FIGS. 4*a* and 4*b*, integrates the chassis floor 405 with a liquid absorbent layer 406 having an electrically conductive material 407 that is mechanically coupled to the top side of the liquid absorbent layer 406. Here, when coolant leaks within the chassis it drips toward the floor 405 and makes contact with the absorbent layer 406. In response, the absorbent layer 406 expands which causes the electrically conductive material 407 to rise vertically away from the floor. Strategically positioned above the conductive material 407 are one or more electrical contacts 408 that, when physical contact is made between the conductive material 407 and the electrical contacts 408, an electrical circuit is closed that, in turn, causes an alarm to be triggered.

In various embodiments, the electrically conductive material 407 corresponds to one or more conductive pads, and, for each pad 407 there two contacts 408 (+ and −). When an electrical pad 407 comes in contact with its two contacts 407, the two contacts 407 are shorted thereby forming a closed circuit that triggers the alarm.

In various embodiments, there are numerous pads 407 dispersed that are mechanically coupled to the absorbent layer's surface and corresponding contacts above them (e.g., to account for non-uniform swelling of the absorbent layer 406, e.g., from coolant droplets being concentrated on a particular region of the absorbent layer). In other embodiments, wiring trace(s) may be run (e.g., on the absorbent layer or other surface coupled thereto) that connect two or more different pads. Here, the two or more different pads need to make contact with their respective upper contacts in order to close the alarm circuit.

In various embodiments the absorbent layer 406 is composed of a super absorbent polymeric (SAP), or other hydrophilic material, that demonstrates significant expansion in response to being in contact with the coolant. In various embodiments, the "super swelling" nature of the absorbent layer 406 stems from the absorbent layer 406 retaining significant amounts of water/liquid within a loosely cross-linked three-dimensional network of polymeric chains. An SAP's expansion (e.g., 400× or more of its original size) can be controlled by the chemical composition of the polymeric material. Because of their ionic nature and interconnected structure, SAPs absorb large quantities of water and/or other aqueous solutions without dissolving by solvation of water molecules via hydrogen bonds, which, in turn, increases the entropy of the network and causes the SAP to exhibit a large swelling response.

The significant expansive response is relied upon to raise the electrically conductive material 407 sufficiently high enough to make contact with its corresponding physical contact(s) 408. The physical contact(s) 408 can be mounted to, e.g., a chassis wall, or motherboard or other structure within the chassis.

The motherboard may be inverted as described above with respect to FIGS. 3a through 3e, or, may be mounted in a traditional fashion to the bottom floor of the chassis. Note that if the motherboard is mounted to the chassis floor, leaking coolant tends to wick to mechanical posts (often used to support the cold plate from where the leak originates) that run through holes in the motherboard and affix to the chassis floor. In this manner, leaking coolant reaches the chassis floor even through the motherboard resides between the source of the leak and the floor.

FIG. 4a shows a specific embodiment in which the electrically conductive pads are on a perforated layer 409 that is placed on the conductive layer 406. Here, the perforated layer 409 may be composed of an electrically insulating material (e.g., plastic). Leaking coolant will run through the perforations in the layer 409 and onto the absorbent later 406. The expansion of the absorbent layer 406 then raises the perforated layer 409 and conductive material 407 so that the conductive material 407 makes contact with the corresponding electrical contacts 408 (that, e.g., are mounted to the walls of the chassis or the side of the motherboard that is facing the chassis floor). During construction of the chassis, the absorbent layer 406 is placed on the chassis floor and the perforated layer 409 with conductive material 407 is then placed on the absorbent layer 406.

FIG. 4b shows more detailed views of the chassis floor design showing both the absorbent layer 406, the perforated layer 409 with pads 407 and contacts 408.

Figure 5A:
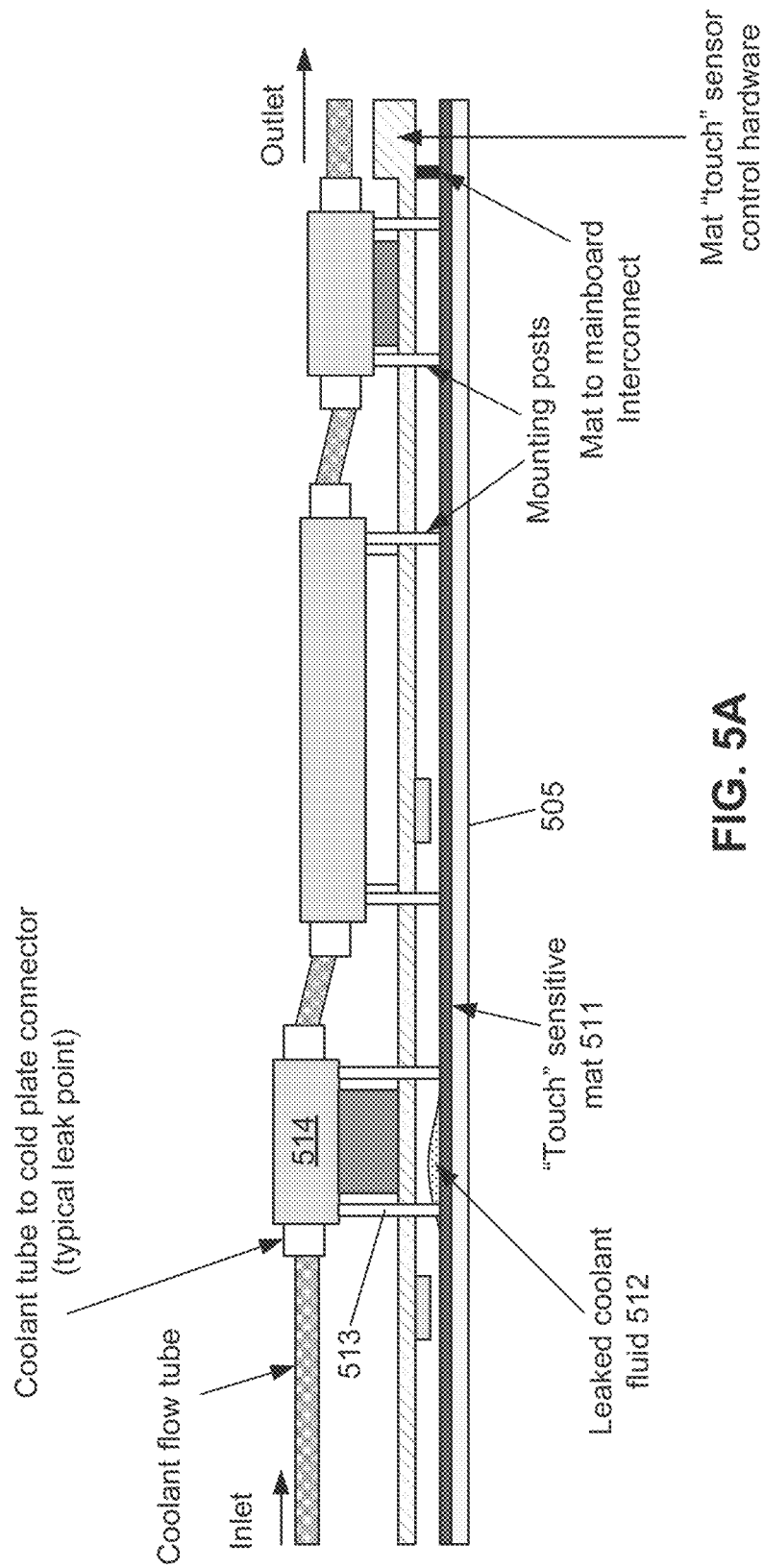
Figure 5B:
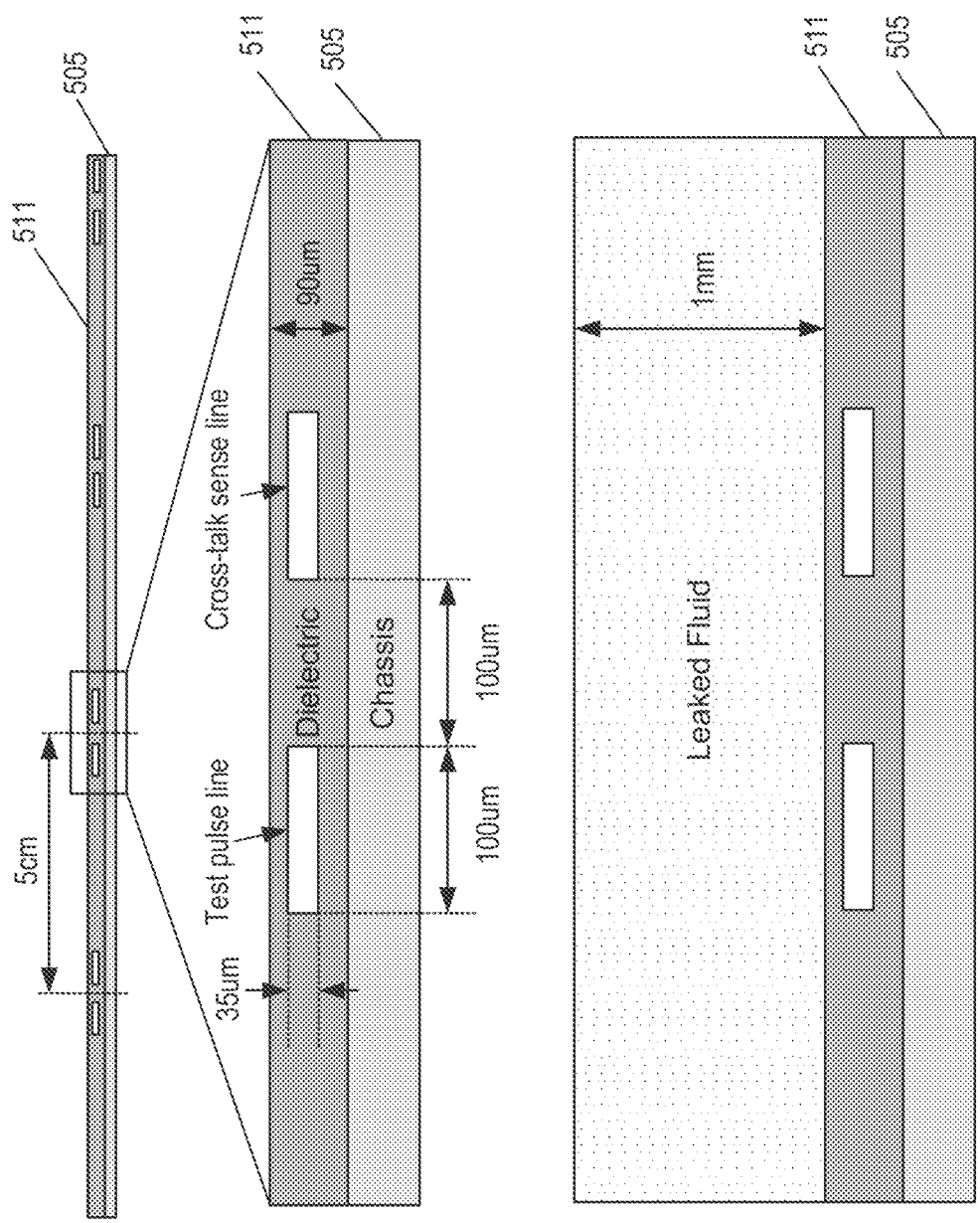

FIGS. 5a, 5b and 5c show another chassis floor leak detection device that provides additional information regarding the location of the source of the leak. Here, as observed in FIG. 5a, a "touch-sensitive" mat 511 is placed along the chassis floor 505 underneath the motherboard 501 which is mounted to the chassis floor 505 in the traditional manner. Again, in other implementations, the motherboard 501 can be inverted (hang from the chassis ceiling).

The touch-sensitive mat 511 operates similarly to the touch-screen on a smartphone in which the mat is able to provide, e.g., x,y coordinate information of where on the surface of the mat has been touched (in this case, by leaking drops of coolant). Such x,y coordinate information can identify, e.g., which particular cooling joint or cold plate is leaking.

As observed in FIG. 5a, coolant 512 has wicked down the mounting post 513 of a particular cold plate 514 and pooled on the mat 511 around the mounting post 513. The mat 511, in turn, is able to electronically identify where the pool exists on its surface (e.g., in terms of x,y coordinates) thereby pin-pointing the source of the leak (cold plate 514 or one of its tubing junctions).

It is believed that the liquid drop/pool "touch mat" 511 can be made cost-effectively. Specifically, at least in relation to the types of touch screens that are integrated into a smartphone, the touch mat 511 of FIG. 5a can be: 1) coarser with respect to touch location resolution; 2) slower with respect to response times; and, 3) non-transparent. All of these characteristics can result in a cheaper touch-sensitive solution than the touch screens that are commonly found on smartphones or other human touch interface electronic systems.

Here, with respect to resolution, x,y coordinates of touch location can be determined from the crossings of orthogonally oriented wires within the mat. However, such crossings can be purposely designed to exist only near cooling plate posts where leakage pools are expected to exist (rather than being uniformly dispersed above the surface of the mat). Reducing the areas of touch sensitivity results in less cumbersome manufacturing and electronic system integration. Even if wire crossings are dispersed evenly across the mat, their resolution can be larger than finger touch screens (e.g., resolution in centimeters, tens of centimeters, or more, can be acceptable).

With respect to response times, immediate touch response is not a strict requirement. Instead, a controller, e.g., embedded on the motherboard and electrically coupled to the wiring within the mat (e.g., through a mat to motherboard jumper connector) can serially "rasterize" touch detections. That is, a first wire crossing in a first mat location are activated to detect if there is touch present (all other wire crossings are deactivated). Then, the first wire crossing is deactivated and a second wire crossing in a second mat location is activated to detect if there is a touch present (all other such locations, including the first location, are deactivated). In essence, the controller is able to detect touch by serially scrolling through the different wire crossings. Touch response times are then approximately granularized to the periodicity of one scroll through the set of crossings. Such rasterization greatly economizes the electronics associated with touch detection.

Since light does not need to shine through the mat for useful application (unlike smartphone touch screens), cheaper dielectric materials can be used for the mat (e.g., plastic, polymers, polyimides, etc.).

In general, the mat 511 can be designed to implement one of various, different types of physical touch detection mechanisms including but not limited to: light emitting diode (LED), surface acoustic wave (SAW), projected capacitive, surface capacitive and resistive touch. Although the capacitive and resistive approaches are generally less sensitive than the LED and SAW approaches, they are cheaper to implement and should be able to satisfy the mat's relatively low performance functional characteristics.

FIG. 5b shows one capacitive/resistive approach in which the presence of liquid on the surface of the mat sufficiently alters the dielectric/resistive region surrounding a stimulus wire and a sense wire such that induced noise on the sense wire from a signal generated on the stimulus wire will be noticeably greater when the liquid is present than when the liquid is not present.

Specifically, according to the dimensions depicted in FIG. 5b, if a 1.3V amplitude pulse is generated along the stimulus wire ("test pulse line"), a noise signal having 103 mv amplitude will be induced on the sense wire ("cross talk sense wire") when coolant is present above the wires, whereas, only a 72 mv amplitude noise signal will be induced when coolant is not present above the wires. Here, the presence of the coolant essentially creates a lower resistance path between the wires than when the coolant is not present resulting in a greater induced signal between the wires when the coolant is present.

The aforementioned controller can therefore be designed to emit a pulse to a stimulus wire and detect from the corresponding sense wire if liquid is present or not. A particular x,y location of the mat can have a wire crossing composed of a set of x coordinate stimulus/sense wire pairs and a set of y coordinate stimulus/sense wire pairs. If both the x and y sense wires of a same crossing yield a higher sense in response to a pulse, liquid is known to exist at the x,y location.

In the approach of FIG. 5b, if the pulse has a sufficiently fast rise time, electromagnetic interference (EMI) could be generated. Here, such EMI can be reduced/negated with adequate grounding of the chassis and/or touch sensitive mat.

FIG. 5c shows an even further economized design in which only three wires 515, 516, 517 are used to provide both x and y coordinates. Moreover, resistance between wires is measured rather than emitting and sensing a pulse (as in the approach of FIG. 5b).

For example, a constant DC voltage is placed on the stimulus wire 515 and the magnitude of the resultant current that flows through either sense wire 516, 517 during the steady state is detected (the constant voltage normalized by the sensed current determines the resistance). The observed pads are exposed and if leaking coolant comes into contact with a neighboring pair of pads, the resistance between them will be affected.

Here, a common stimulus wire 515 is used for both the x and y stimulus signals, a single y coordinate sense wire 516 is used to detect the y coordinate and a single x coordinate sense wire 517 is used to detect the x coordinate. FIG. 5c shows a grid of x,y touch locations on the mat surface. As described above, the touch locations can be populated only in strategic areas of the mat surface as desired.

Notably, for any of the solutions described above with respect to FIGS. 3a,b,c through 5a,b,c, the solutions can be placed on the underside of other components of a data center that employs liquid cooling such as any of a rack, a CDU, a chilling unit or water tower.

2.0 Point of Leak Liquid Detection Devices

Another type of improvement seeks to identify the existence of the leak (and at least in some circumstances contain the leak) at or near the location of the leak. In essence, these devices tend to be integrated with the tubing and/or cold plate assemblies of the liquid cooling system rather than the floor of the electronic system (or rack or CDU). The close proximity of the detection device to the leak not only has the potential to precisely identify the source of the leak, but also, to prevent the coolant from spreading (for embodiments that also contain the leak).

Here, it has been observed that leaks typically occur at some kind of physical juncture between two different components that help effect the overall fluidic channel. For example, a "quick-connect-quick-disconnect" ("QCQD") is a mechanical connector that clamps the ends of two different hoses to opposite ends of rigid tube piece to effect a same, continuous fluidic channel through both hoses.

Unfortunately, owing to, e.g., tolerances associated with the mechanical elements of a QCQD and/or the hoses, a perfectly sealed channel between hose ends is not formed resulting in a leak. Leaks can similarly emanate at the junction between a hose and another component of the liquid cooling system (e.g., cold plate, manifold, heat exchanger, chassis input port, chassis output port, etc.). These junctions, for instance, clamp a hose end that slides over a nozzle that emanates from the component. As such, the devices described immediately below can be placed proximate to any of these junctions.

Figure 6A:
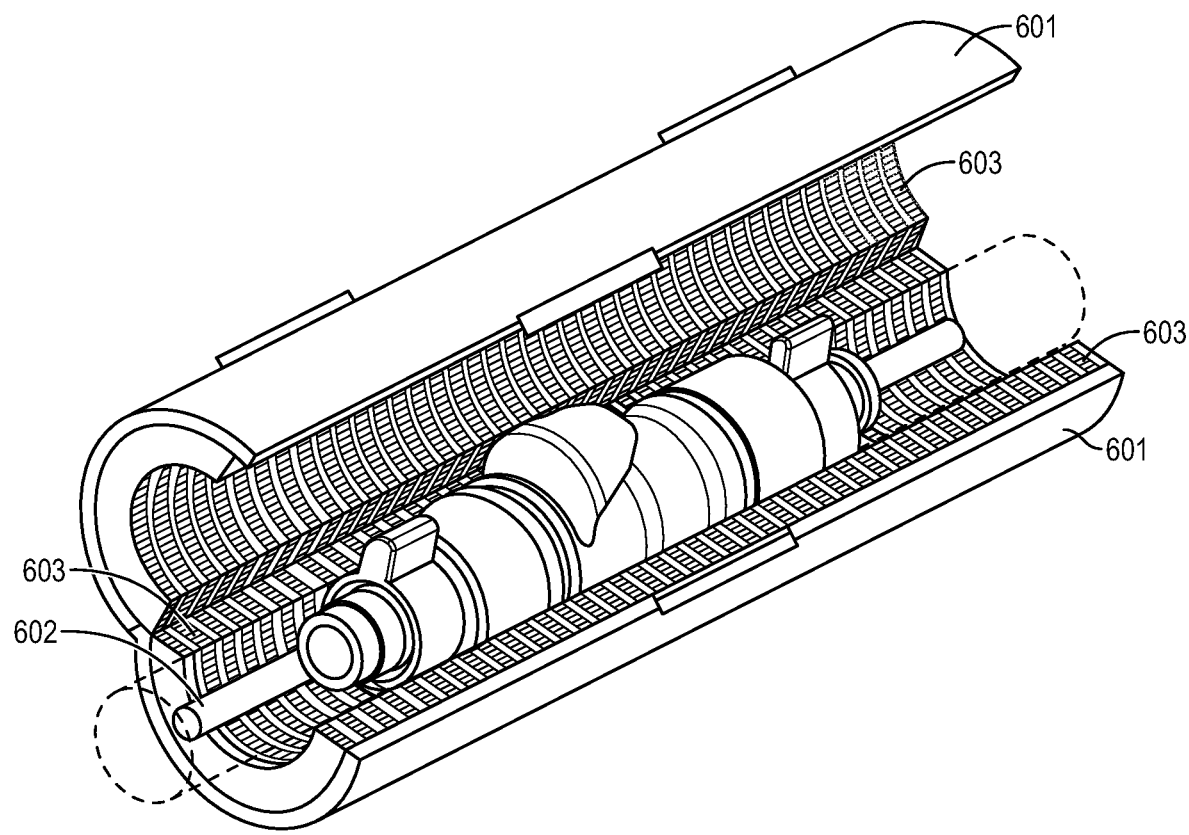

FIGS. 6a and 6b depict an embodiment of a cover 601 designed as a clamshell device that covers a QCQD, or other junction between two fluidic channel component ends, and can detect the presence of a leak that emanates from the QCQD/junction.

Here as observed in FIG. 6a, a leak detection cable 602 is clamped by the clamshell 601 along the QCQD/junction to secure the cable 602 against the fluidic channel within the clamshell 601. Here, when the clamshell 601 is open, the cable 602 is laid alongside the QCQD/junction and hoses, nozzle, etc.

Figure 2A:
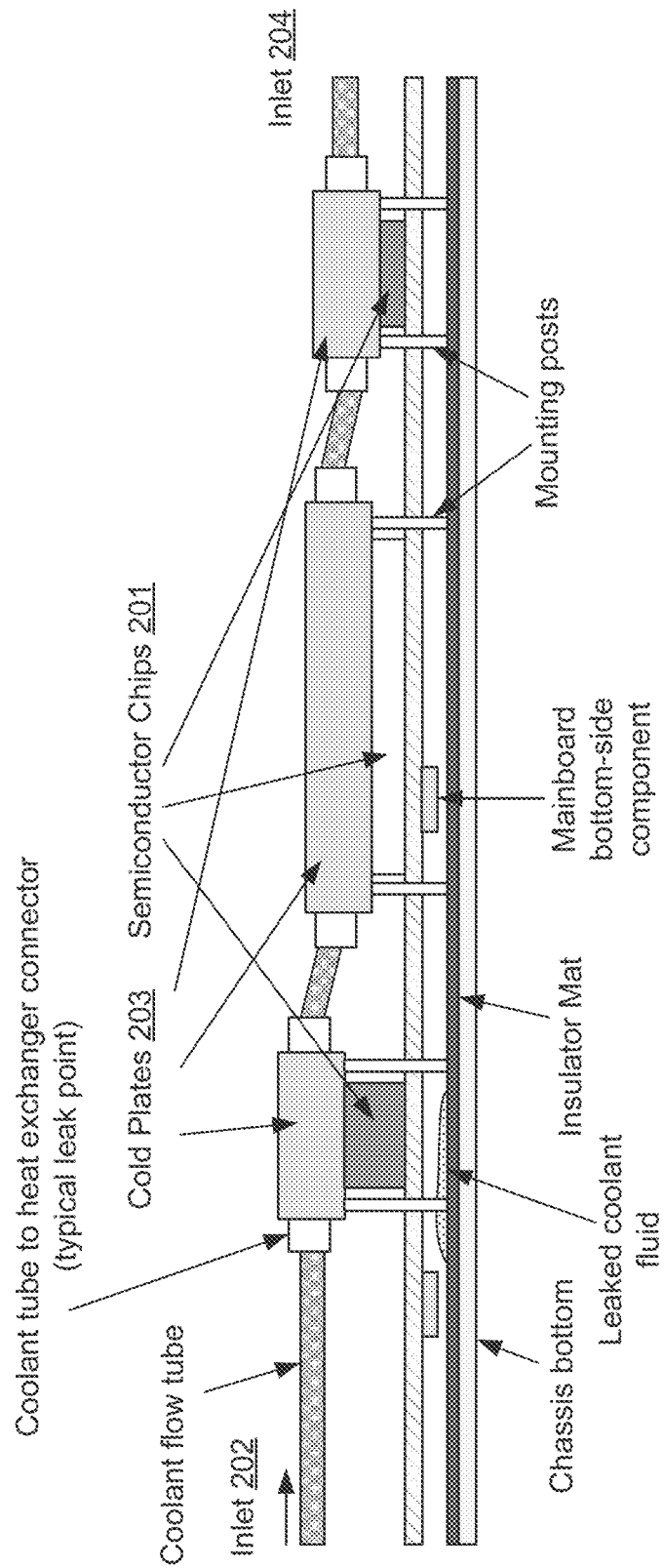
FIG. 2a shows a leak in a liquid cooling system (prior art)
Figure 2B:
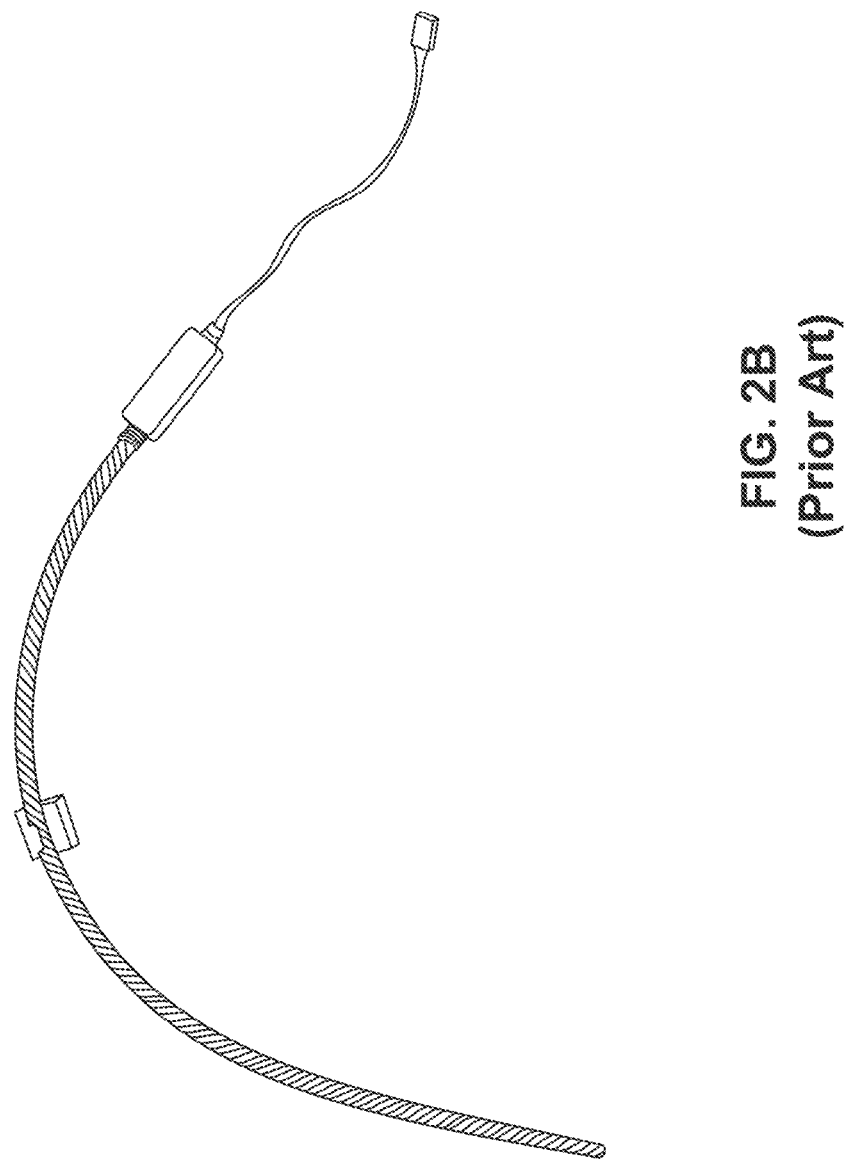
FIG. 2b shows a liquid detection rope (prior art)

The clamshell 601 is then closed which rigidly secures the cable 602 along the QCQD/junction. The cable 602, in various embodiments, is designed and/or operates similar to the rope described above with respect to FIG. 2b, but has thinner diameter (is finer) to more easily integrate along the fluidic channel within the clamshell 601. Here, if a leak emanates from the QCQD/junction, it wets the cable 602 and shorts the wires that are threaded through the cable, which, in turn, triggers an alarm.

Moreover, the inner face of the clamshell 601 is lined with absorbent material 603. As such, should the QCQD/junction begin to leak, the absorbent material 603 will contain the leak (the leaked fluid is absorbed by the absorbent material 603). In various embodiments the absorbent material 603 need not be super-absorbent because the cable 602 will trigger an alarm shortly after the leak starts. IS technicians are therefore presumed to quickly investigate and mitigate the problem before the absorbent material 603 saturates with leaked fluid. In still other embodiments, the absorbent material 603 is a higher hydrophilic material to give the IS technicians more time to investigate and mitigate the problem.

FIG. 6b shows the clamshell device clamped over a hose to cold plate nozzle junction and a host to heat exchanger junction. Here, the same principles as described above with respect to FIG. 6a apply.

FIG. 6c shows another use of a leak detection cable having finer dimensions that the typical leak detection rope described above with respect to FIG. 2b. Specifically, as observe in FIG. 6c, the cable 604 is wound around or at least in the vicinity of a host to component junction such as a host to cold plate junction.

Figure 7A:
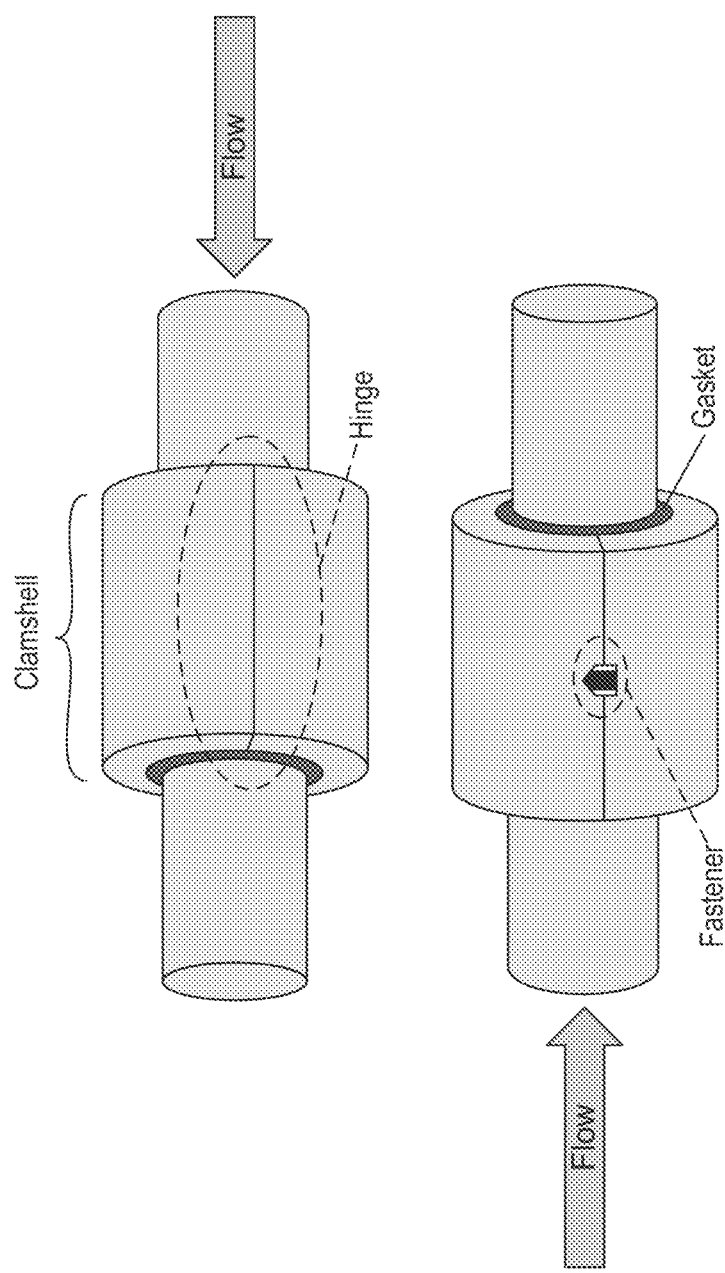
FIGS. 7a, 7b and 7c show a clamshell and sleeve with integrated leak detector.
Figure 7B:
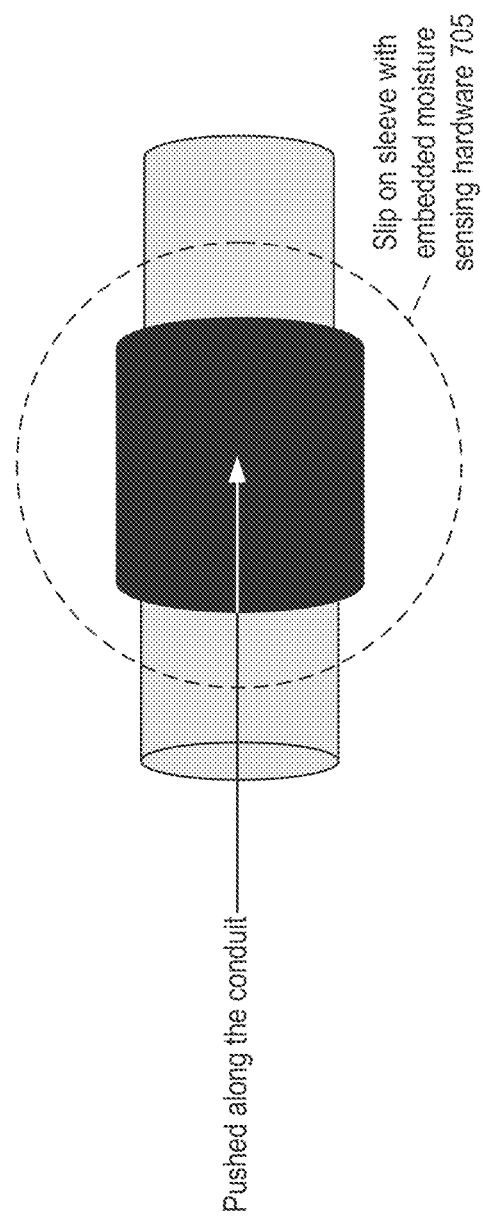
Figure 7C:
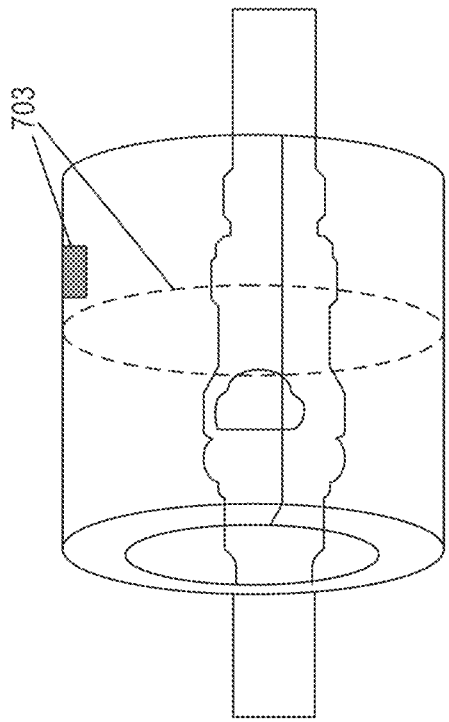

FIGS. 7a, 7b and 7c show another design that is similar to the clamshell design of FIGS. 6a and 6b. The design of the cover of FIG. 7a is a clamshell like the design of FIGS. 6a and 6b. Additionally, the clamshell is fitted with gaskets on both ends to, e.g., help clamp the clamshell to different sized QCQDs/junctions and hoses.

The cover of the leak detection device 705 of FIG. 7b, by contrast, is a sleeve rather than an open/close clamshell. Here, with the device 705 of 7b, when a junction is formed (with a QCQD or otherwise), the leak detection device 705 is slipped over an opposite hose end and slid along the length of the hose until it covers the QCQD/junction. In an embodiment, a liquid detecting cable is laid alongside the hose and the detection device sleeve 705 is slipped over both the hose and the cable at the hose end. The device sleeve 705 then slides over both the cable and hose until it covers the junction. In this case, the device operates similarly to the device discussed above with respect to FIGS. 6a,b and 7a.

As depicted in FIG. 7c, a leak detection sensor 703 is integrated into either the clamshell of FIG. 7a or the sleeve of FIG. 7b. As such, the clamshell or sleeve need not cover both the junction and a cable that is laid next to the junction. Rather, in effect, a device 703 that operates similarly to the cable 603 of FIG. 6a is integrated within the clamshell/sleeve. Specifically, as observed in FIG. 7c, one or more wires are run circumferentially along the clamshell/sleeve. When leaking fluid contacts both wires they become shorted, which, in turn, generates an alarm signal (e.g., from a communication device (e.g., RFID tag) that is also embedded in the sleeve).

In an embodiment, the leak detection sensor 703 is a moisture sensor that is, e.g., powered by an RFID inquiry from a host (e.g., the system the clamshell/sleeve is integrated within) and provides an output of the moisture level. Between each enquiry, the sensor is in sleep mode. Wireless communication, such as RFID, allows for wire or cable free operation. Because the sensor operates in a same/similar manner as an RFID tag, the location of the leak is easily identifiable as the location of the senor 703.

The clamshell/sleeve design of FIGS. 7a,b,c can be lined on the inside with absorbent material to contain a leak in addition to detecting the leak. Moreover, in extended embodiments, the sleeve of FIG. 7b can be composed of hydrophilic material so that sleeve itself absorbs the leak.

As explained in more detail further below with respect to Section 4.0 below, the clamshell/sleeve devices of FIGS. 6a, 6b, 7a and/or 7b can be fitted with a vapor other similar sensor that reacts to a gas, vapor, odor or other airborne particulate that is associated with the leak rather than leaking liquid.

Figure 8A:
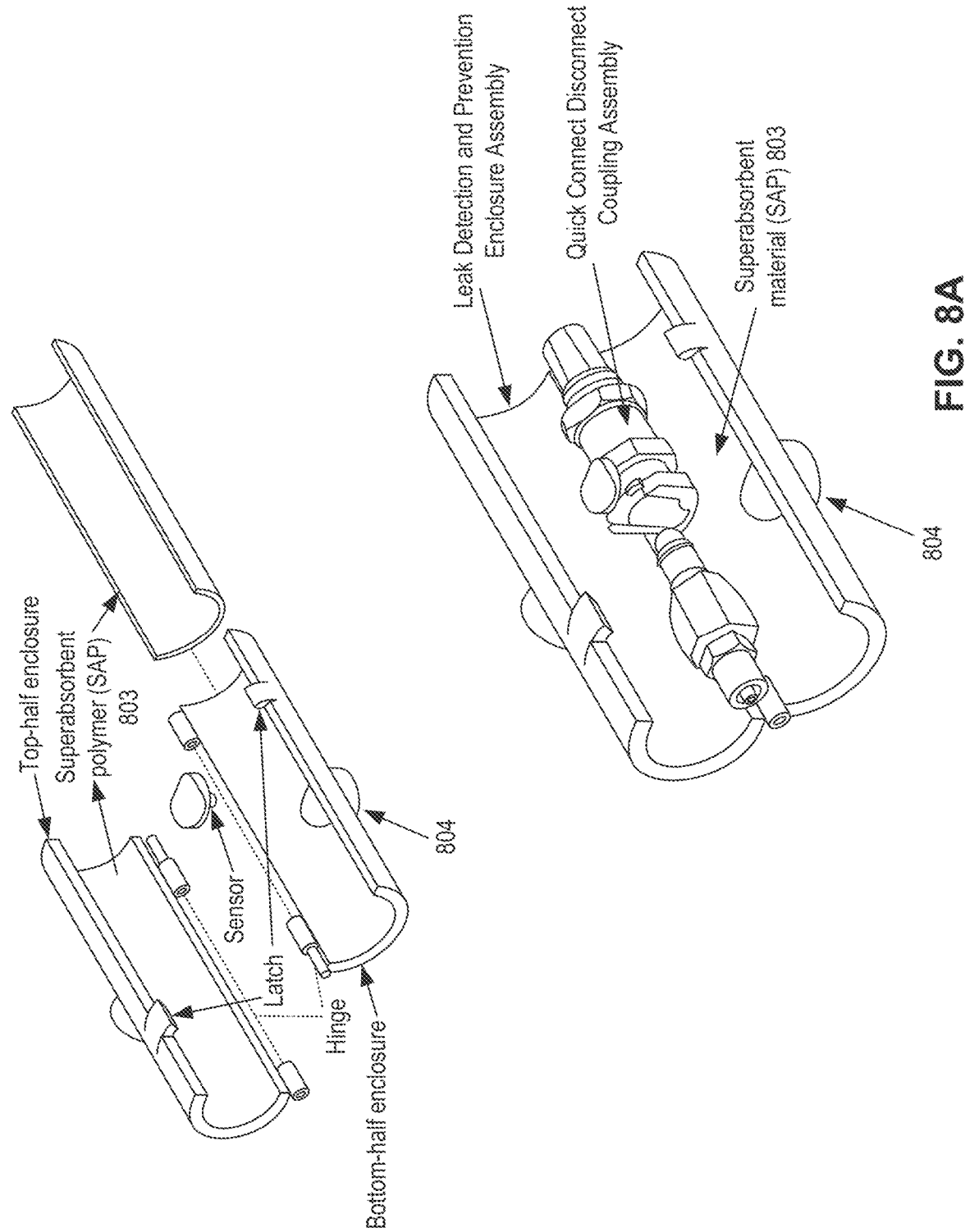
FIGS. 8a and 8b show a clamshell with absorbent inner lining and integrated leak detector.
Figure 8B:
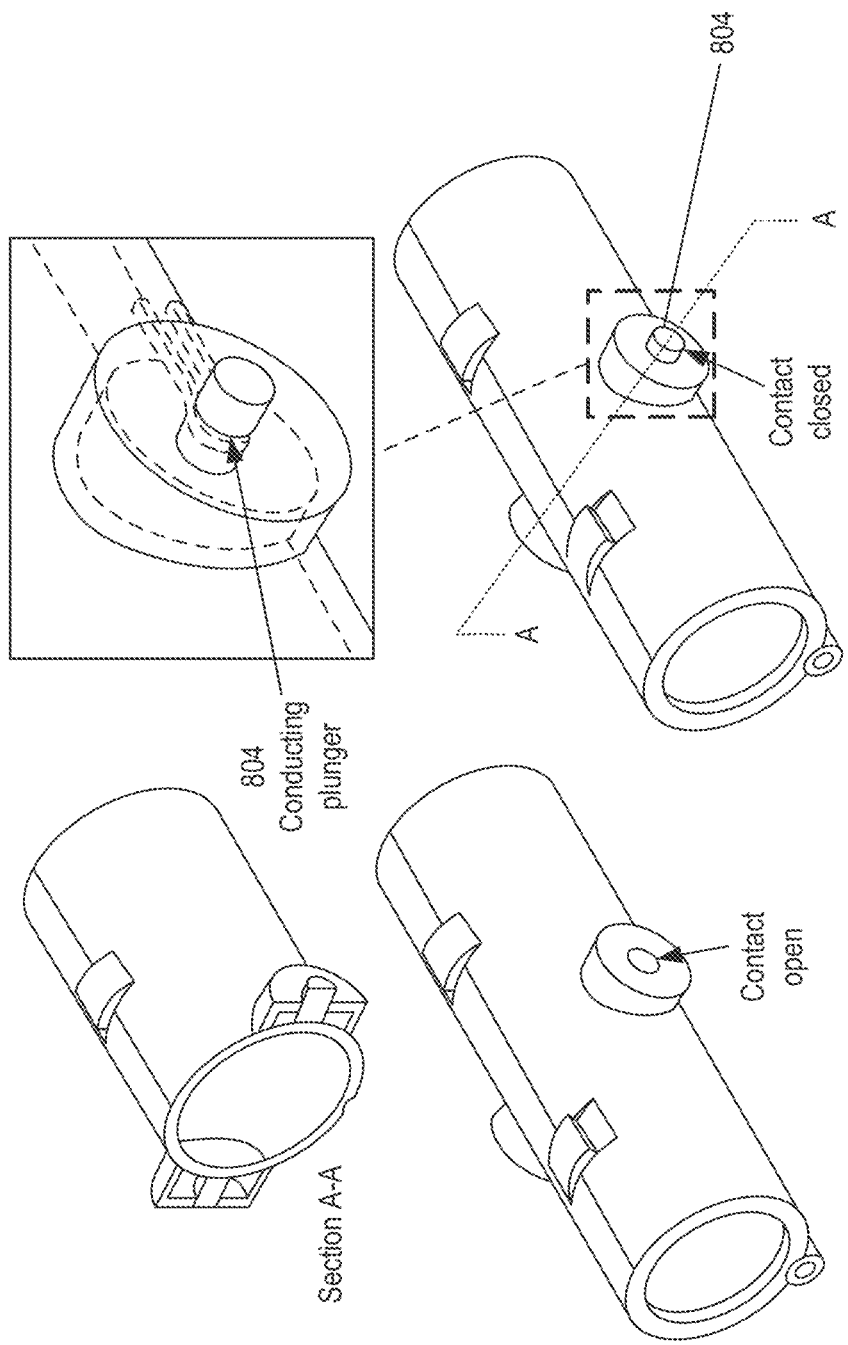

FIGS. 8a and 8b show another clamshell design that, akin to the SAP approach discussed above with respect to FIGS. 4a and 4b, uses a super expansion of SAP material to trigger a mechanical alarm signal. Specifically, the inner face of the clamshell is aligned with SAP material 803. In response to fluid that leaks from the junction coming in contact with the surrounding SAP material 803, the SAP material 803 expands which pushes a button or plunger 804 from a recessed position to an extended position. Here, if the SAP material 803 is dry (no leak), the button/plunger 804 remains within its housing.

By contrast, when the SAP material 803 is wet (leak), the expanding SAP material 803 pushes the button/plunger 804 so that it emerges from its housing. The emergence of the button/plunger 804 can close an open circuit that is nominally open when the button/plunger 804 is within the housing, thereby triggering an alarm (e.g., the top surface of the button/plunger has conducting material and it touches two contacts to complete a circuit when it emerges).

FIGS. 9a, 9b, 9c and 9d pertain to another embodiment that integrates a liquid sensor with a hydrophilic material. However, the sensor/hydrophilic integration is implemented as layered structures, e.g., in the mechanical support of a liquid cooling system component (e.g., having some significant mass) from which leaks can emanate. For example, the sensor/hydrophilic components are implemented as mechanical layers between a cold plate and motherboard.

Here, as is known in the art, electrical I/Os on the underside of the package of a high performance semiconductor chip, or multi-chip package, are soldered to corresponding I/O pads on the motherboard or other printed circuit board (PCB). A bolster plate is mounted to the motherboard/PCB around the packaged chip/module. Here, looking down at the bolster plate and packaged chip/module from above the motherboard/PCB surface, the bolster plate takes the form of a frame and the packaged chip/module is located within the frame opening. The cold plate is then attached to the bolster frame with its underside surface in contact with the top surface of the chip/module package.

Figure 9A:
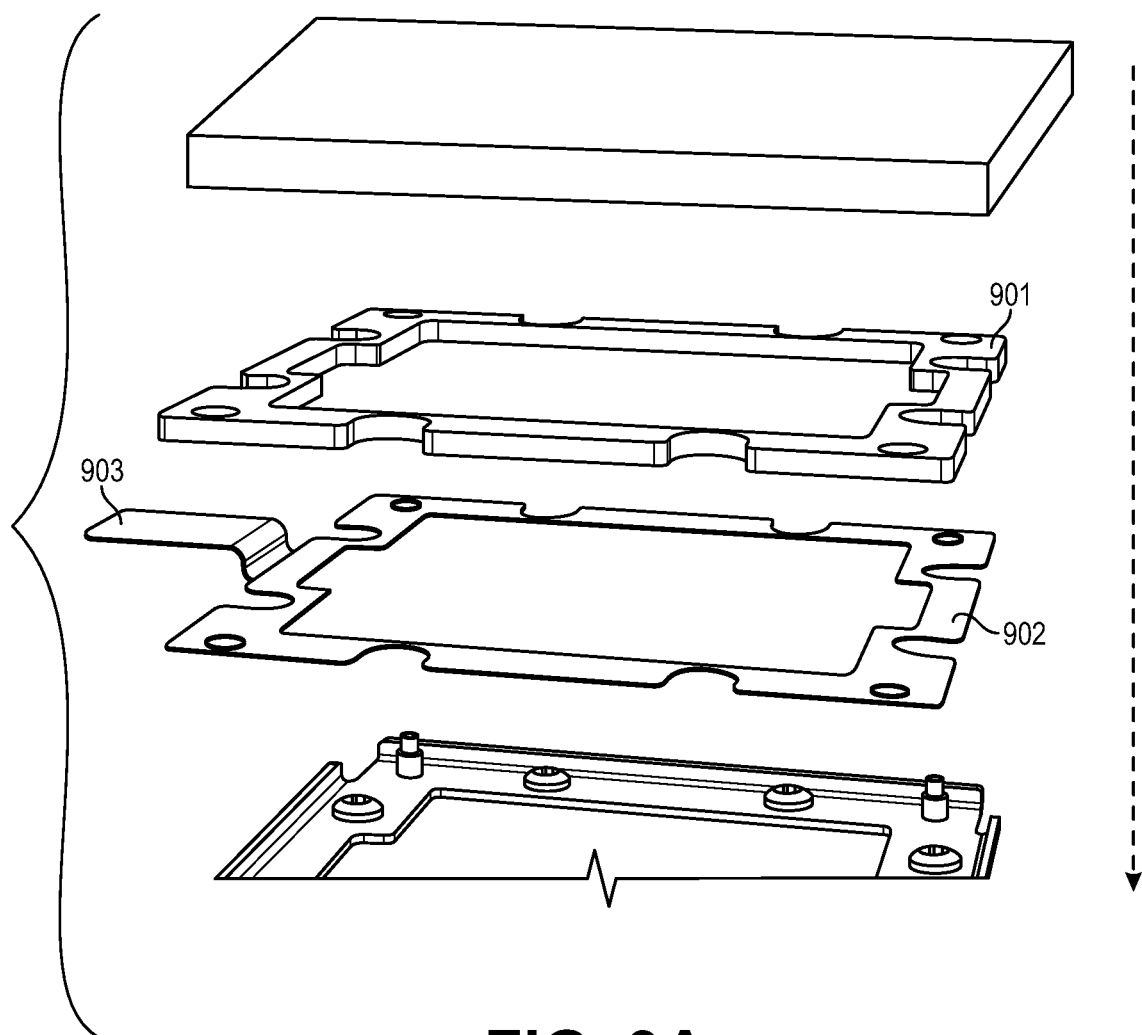
FIGS. 9a, 9b and 9c depict a wick and sensor integrated in a cold plate mechanical assembly.

The bolster plate bears a percentage (e.g., most) of the weight of the cold plate to prevent damage to the I/O connections underneath the package. In the embodiment of FIG. 9a, an absorbent wick 901 and liquid sensor 902 are frame shaped so that they can be placed directly on the bolster plate between the bolster plate and cold plate. Here, if any leaks are formed at the hose junctions to the cold plate, the leaking fluid is apt to run down the sides of the cold plate and into the absorbent wick 901. The absorbent wick 901 absorbs the leaking fluid. The liquid sensor 902 beneath the wick 901 detects that the wick 901 has become wet and generates an alarm. Notably, the liquid sensor includes, e.g., a tab 903 that provides one or more electrical I/Os and a corresponding signal when it detects that the wick is wet.

Figure 9B:
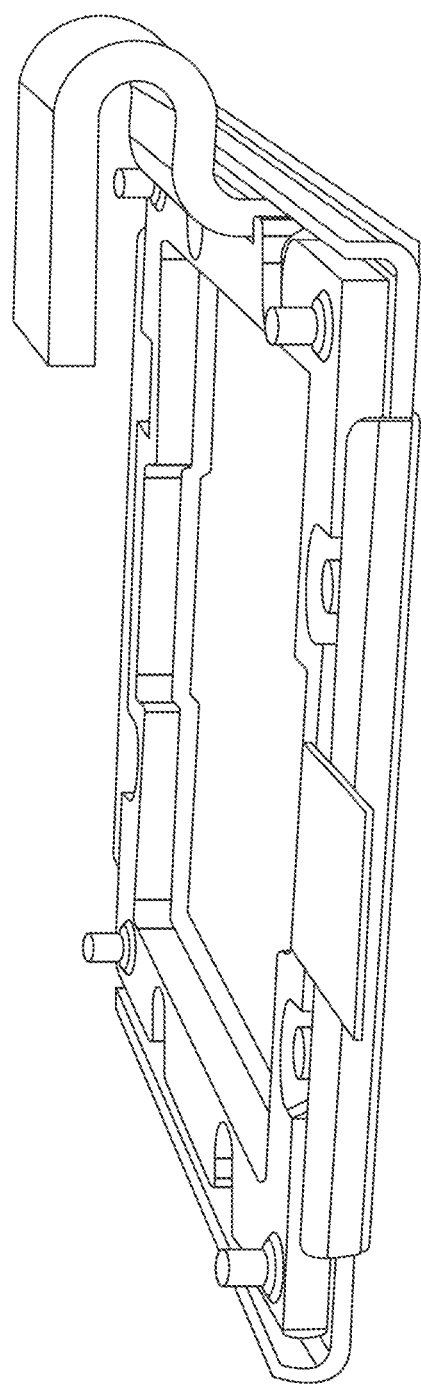

FIG. 9a shows an exploded view while FIG. 9b shows the final mechanical assembly without the cold plate.

Notably, as with the clamshell and sleeve designs described above, the absorption of the leaking liquid essentially contains the leak thereby preventing damage to the motherboard or its electronic components.

In other or combined embodiments, the wick 901 and detector 902 may be placed on the other side of the motherboard than the cold plate (e.g., on the "backside" or "underside" of the motherboard between the bolster plate's backing plate and the motherboard). Here, the bolster plate can be mounted to posts that emanate from a backing plate and extend through holes in the motherboard (the backing plate is mounted to the backside/underside of the motherboard). In this case, leaking liquid is apt to run from the cold plate to the bolster plate and posts, and then through the holes in the motherboard where it is absorbed by the absorbent wick and detected by the sensor. In this design, the wick and sensor need not be frame shaped but should be present near the aforementioned holes/posts.

In still other embodiments, the wick 901 and sensor 902 may be placed between the bolster plate and motherboard on the motherboard surface where the chip/module package is mounted to the motherboard.

In various embodiments one or more of the absorbent wick and sensor are surface components of the mechanical assembly and/or motherboard rather than being individual elements. For example, with respect to the design of FIGS. 9a and 9b, the underside of the cold plate or bolster plate may have an integrated wick and/or the upper surface of the bolster plate and/or motherboard may have an integrated liquid sensor.

In various embodiments the wick is composed of a lightweight hydrophilic material such as Kevlar™ or Nomex™ or can be composed of an SAP material as described above with respect to FIGS. 4a and 4b.

In various embodiments the liquid sensor is a thin film electronic component (e.g., akin to a flexible, flat, cable (FFC)) composed of a thin film dielectric as its substrate and having exposed electrical wires formed thereon. As with the aforementioned rope or cable, when liquid reaches the surface of the sensor the wires are shorted which generates an alarm signal. The sensor's electrical I/Os may be directly connected to the motherboard (e.g., the flap 903 of FIGS. 9a, 9b is bent down to make contact with the motherboard), or, a jumper with connectors may be used to make an electrical connection between the sensor and the motherboard.

In various embodiments, the wick may take the form of a "sack" that the cold plate and/or cold plate mechanical assembly is placed within. The sensor is then placed outside the sack and in contact with the sack so that if the sack becomes wet with the leaking liquid the sensor will detect the leak.

Figure 9C:
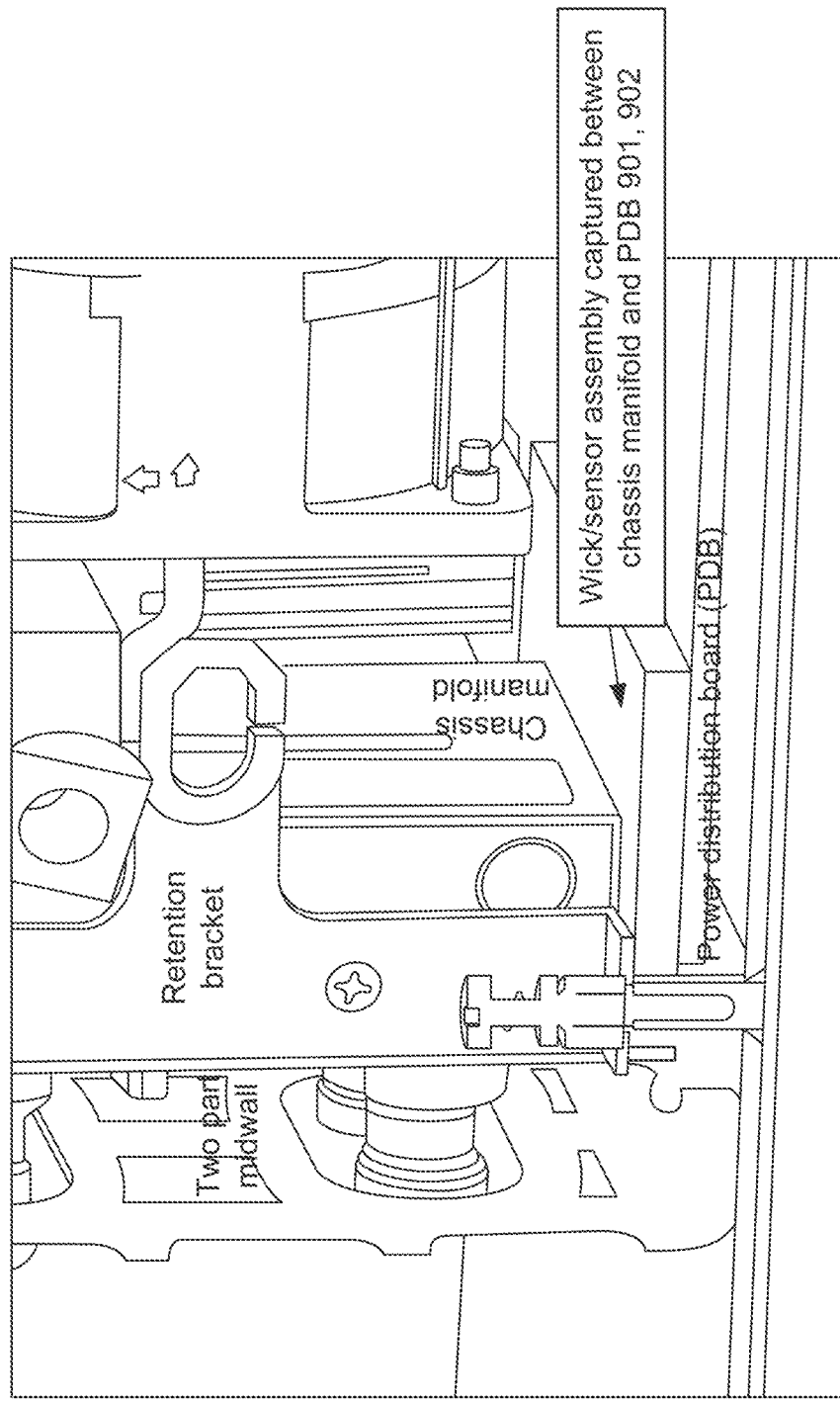

Although the embodiments of FIGS. 9a and 9b have stressed detecting leaks emanating from a cold plate that is mechanically coupled to a semiconductor chip package/module, the principles of the approach can be applied to other components of the liquid cooling system other than the cold plate. For instance, FIG. 9c shows the wick and sensor 901, 902 being placed beneath a manifold of the liquid cooling system (that is located near a cooling fluid entrance/exit port of a system chassis). The wick/sensor is mounted on a power board because, in the particular chassis design, the manifold is supported by the power board. However, other chassis designs may use other features of the chassis to support a manifold (e.g., motherboard, chassis floor, etc.). As such, the wick/senor may be likewise mounted to any such features.

Figure 9D:
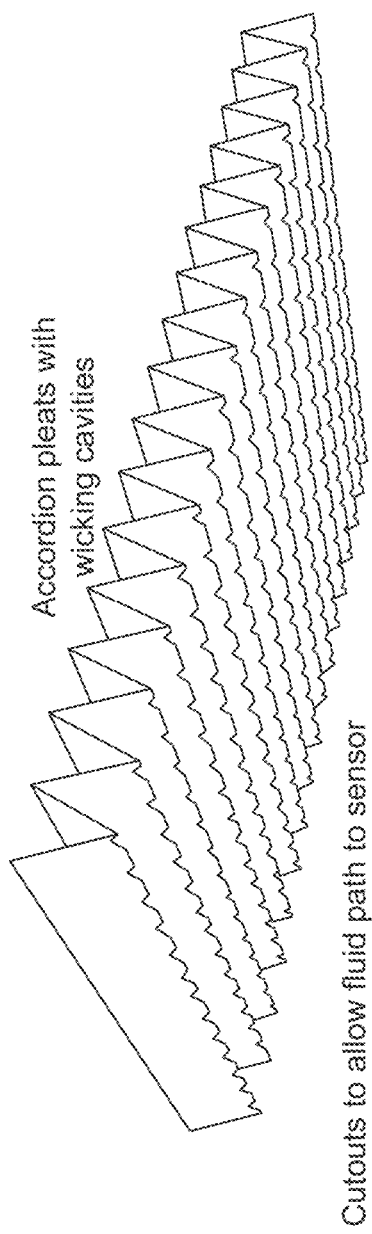
FIG. 9d shows a liquid collection apparatus.

FIG. 9d shows a wick design that is shaped like an accordion to collect leaking fluid and then channel it to a sensor. According to the particular wick design of FIG. 9d, leaking fluid is collected in the grooves of the accordion and drips onto the sensor (not shown) through holes dispersed in the grooves. In various embodiments, where the wick is designed to channel/collect leaking fluid and channel it to a sensor, the wick is designed with hydrophobic material rather than hydrophilic material to promote the runoff of the fluid. Shapes other than an accordion are also possible, e.g., bowl shaped, angled as in FIGS. 3b, 3d, etc.

Figure 1:
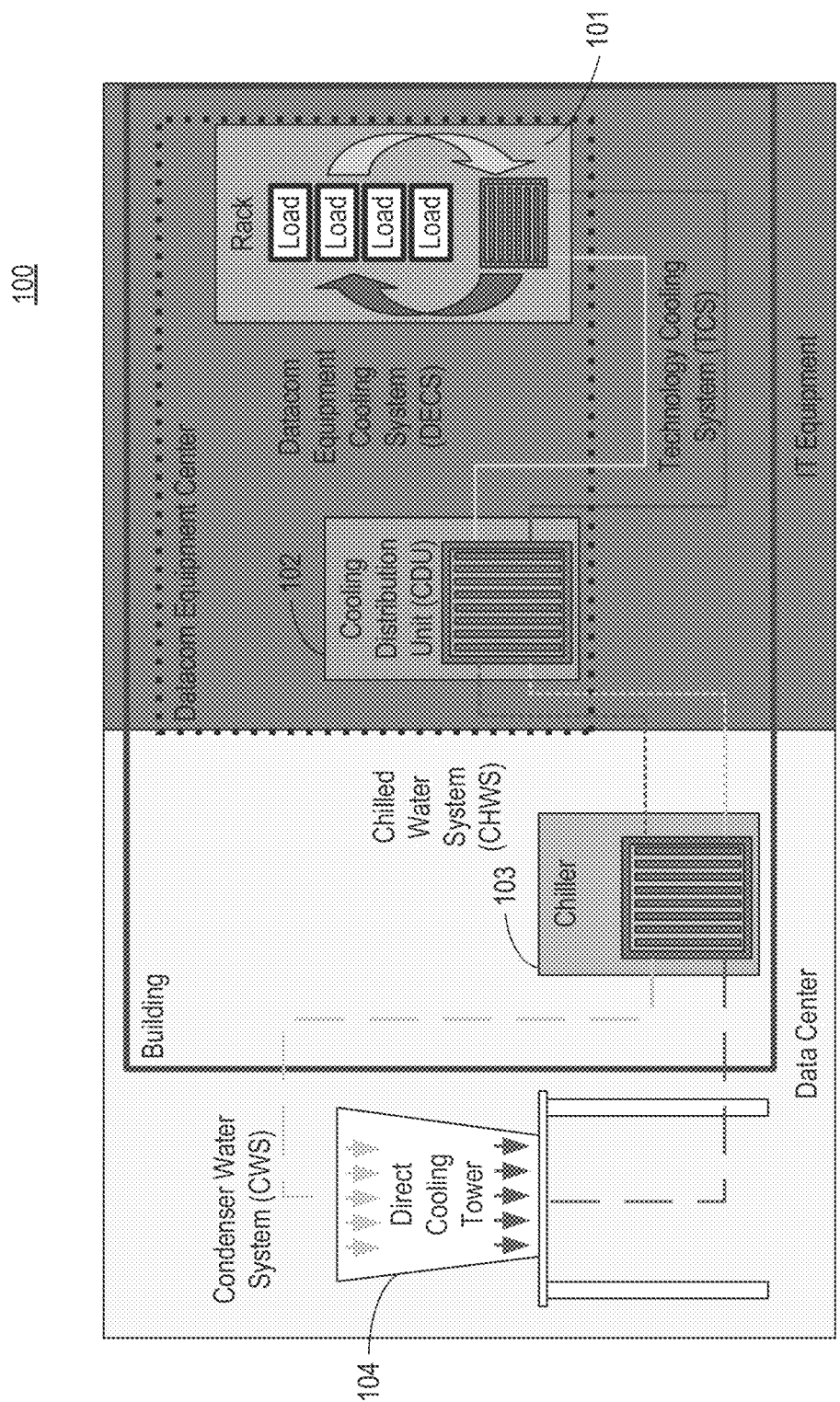
FIG. 1 shows liquid cooling systems of a high performance computing environment (prior art)
Figure 10A:
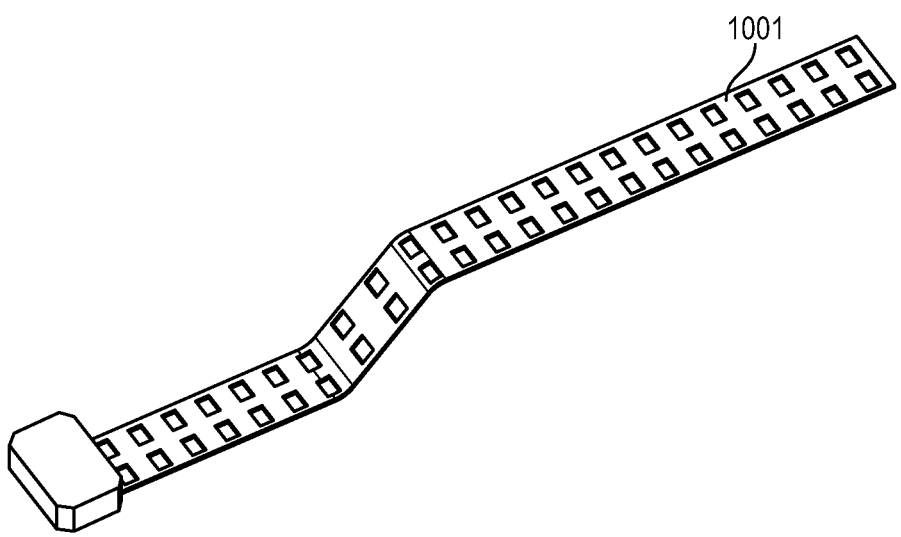
FIGS. 10a and 10b show a flat flexible cable leak detector.
Figure 10B:
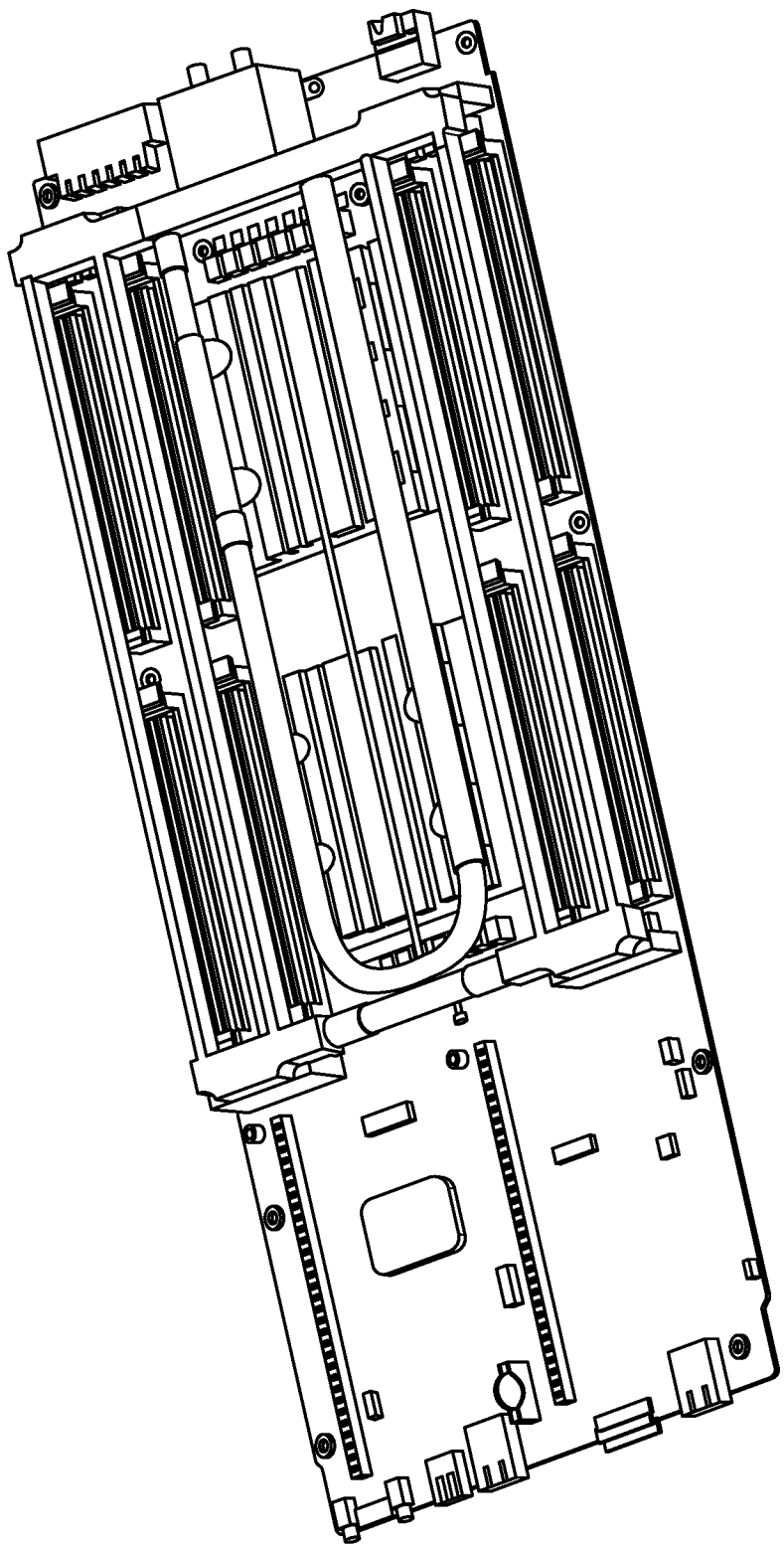

FIGS. 10a and 10b show yet another embodiment where a liquid sensor is formed as a flat, flexible, cable (FFC) 1001 rather than a rope as described above with respect to FIG. 1. Here, FFCs are known in the art and have been used in various technical areas to provide flexible, electrical wiring (e.g., between two components where at least one of the components moves, such as the between the magnetic recording head of a hard disk drive and the fixed electronics of the hard disk drive).

For leak detection purposes, the flat, flexible cable is composed of flexible dielectric material having exposed wires on one surface that are isolated from one another according to the electrical design of the cable. Again, if leaking liquid makes contact with the surface having the exposed wires and touches a pair of wires, an electrical short is created which can be used to trigger an alarm. Additionally, a side of the cable opposite the exposed wires (and/or the regions of dielectric on the side of the cable having the exposed wires) is coated with an adhesive so that the flat cable can be adhered, like tape, to a surface within a system chassis at/near any location (such as a liquid cooling system component or junction).

In cases where the side opposite the exposed wires is coated with adhesive and is electrically insulating, the cable/tape can be adhered/taped anywhere in the system to any component within the system without fear of creating electrical shorts with other components within the system. As such the cable/tape can be adhered to a printed circuit board (PCB) (e.g., around a high performance chip/module package), between cards, one or more cooling components, one or more hoses, a chassis floor, etc. Strategic placement of shorter runs or "stubs" of the FFC can be placed at specific weak points (specific liquid cooling system components or junction), e.g., where one stub exists for each weak point. With this approach a leak can be pinpointed to a specific component/junction (because the component's/junction's own dedicated stub detected the leak).

Any end of the cable can have a connector for easy electrical connection to a PCB board to assert the alarm signal in case of a leak.

3.0 Liquid Leak Detection Based on a Change in a Flow

Another type of improvement seeks to identify the existence of the leak from changes or differences that are observed in, e.g., a flow of some kind that travels through a chassis, rack or CDU. For example, during nominal operation within a chassis, a flow within the chassis maintains a first level. Then, after a leak appears, there is a change in the flow that results from the leak. The change in flow is detected and used to generate an alarm signal.

Figure 11A:
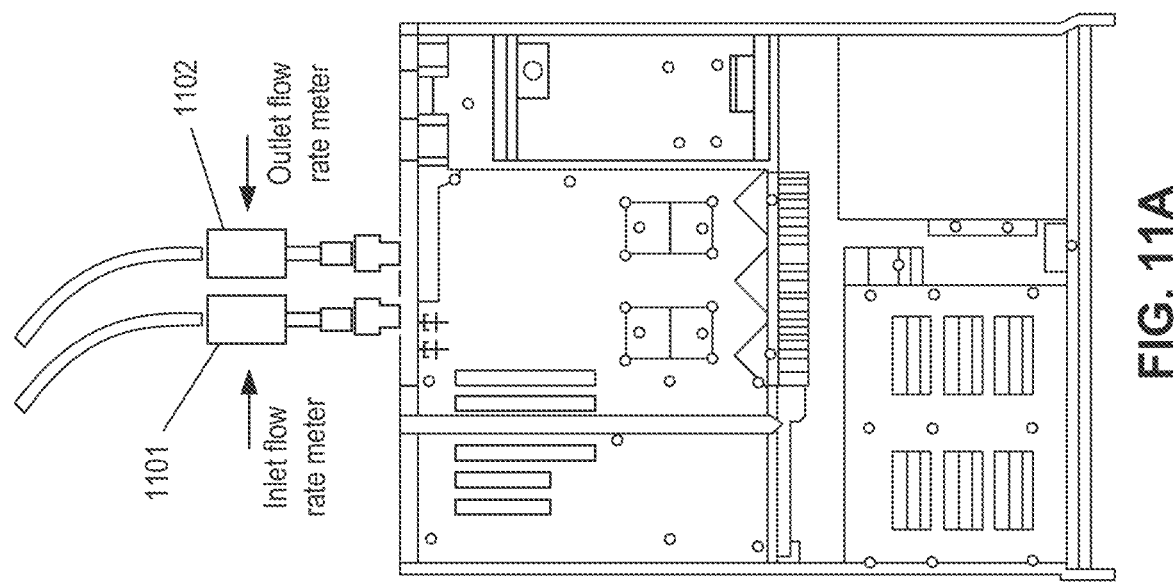
FIGS. 11a and 11b pertain to a fluid flow difference leak detection technique.
Figure 11B:
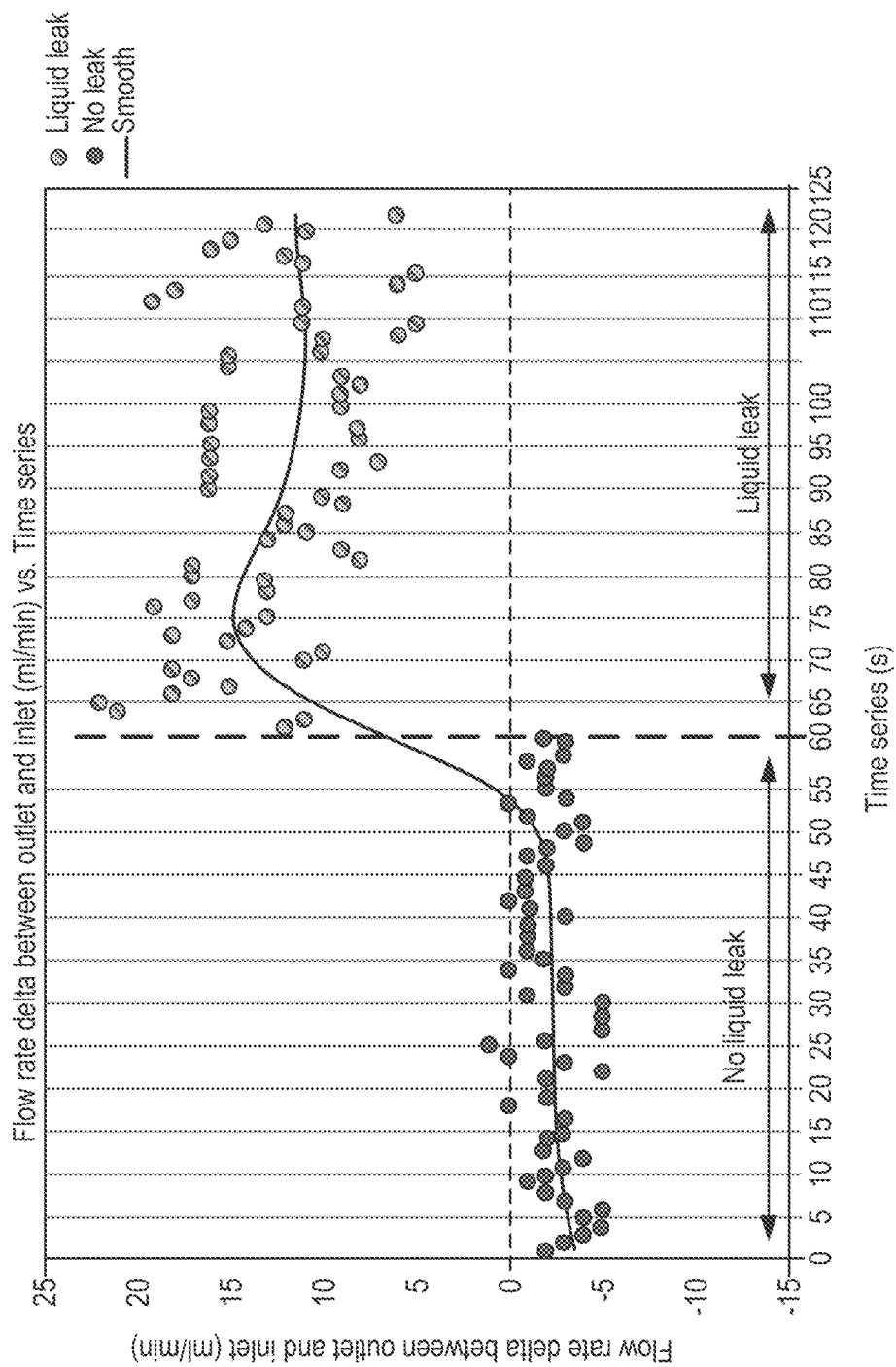

FIGS. 11a and 11b pertain to a first embodiment, where, as observed in FIG. 11a, a first flow meter 1101 is placed along a conduit of a liquid coolant system where the coolant fluid that enters a chassis flows, and, a second flow meter 1102 is placed along a conduit of the liquid coolant system where the coolant fluid that leaves the chassis flows. Here, ideally, with no leaks in the fluidic system within the chassis, the flow of coolant fluid that enters the chassis (e.g., at its input port) should be approximately the same as the flow of coolant fluid that exits the chassis (e.g., at its exit port). Some fluidic pooling, collection or other anomalies may exist in the fluidic system within the chassis and account for a minor difference between entrance and exit flows in their nominal (no leak) state.

However, in the case of a leak, the difference in entrance and exit flows should be immediately noticeable from the nominal (no leak) state. FIG. 11b shows experimental data that demonstrates the effect. As can be seen in FIG. 11b, when no leaks exist, the difference between entrance and exit flows is negligible. However, when a leak appears, the difference between entrance and exit flows is pronounced (with the exit flow being less than the entrance flow). As such, the entrance and exit flow meters can be wired, e.g., to a controller that constantly detects the flow observed by both sensors and calculates the difference between the two. If there is a substantial observed difference in flow rate, the control signals an alarm that a leak is present. The controller can be located in the chassis or be coupled to the rack that the chassis is mounted to.

Figure 12:
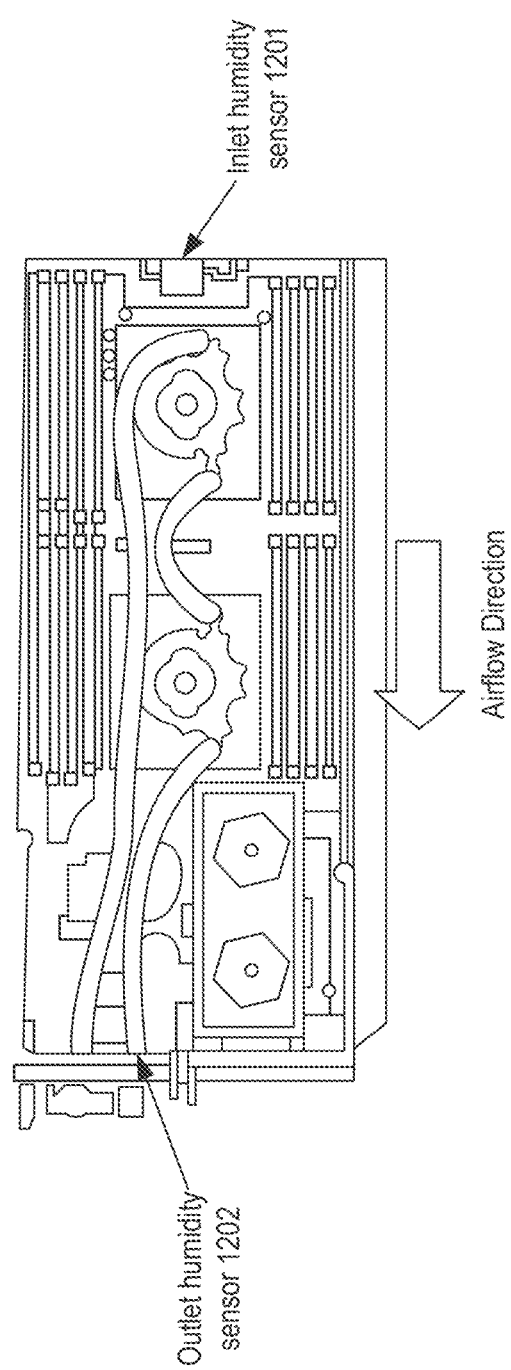
FIG. 12 pertains to an air flow humidity difference leak detection technique.

FIG. 12 shows another embodiment where the difference in the humidity of air entering and leaving a chassis is compared. Here, a humidity detector 1201 resides near an input air vent, and, another humidity detector 1202 resides near an output air vent. Liquid cooling is generally applied to the most power hungry devices within a system. Air cooling is therefore still suitable for the many lesser performing devices that are also integrated in the same system. As such, electronic systems typically contain fans or otherwise have air that is forcibly drawn or blown into input vents that are formed, e.g., along a wall of the chassis, and, have exit vents where the air exits the chassis.

If a leak in the liquid cooling system within a chassis were to occur, the leaking fluid would raise the moisture or humidity level of the air within the chassis. As such a leak can be detected by comparing the difference between the humidity levels of the input air flow and the exit air flow. Specifically, in the case of no leaks in the liquid cooling system, the humidity levels of the input air and the output air should be approximately the same. By contrast, if there is a leak in the liquid coolant system within the chassis system, the humidity of the exit air should noticeably exceed the humidity of the input air. Thus, in various embodiments, the humidity detectors 1201, 1202 are coupled to a controller within the chassis or mounted to the rack which continuously monitors the humidity levels of the input and exit air. When a substantial difference is detected between the two (and with the humidity level of the exit air being higher than the input air), the controller signals an alarm that a leak exists within the system.

In another embodiment, both the detection techniques of FIGS. 11a,b and 12 are combined into a same leak detection system. Here, if a change in input/output fluid flow and a change in humidity is detected, an alarm will be sounded.

Figure 13A:
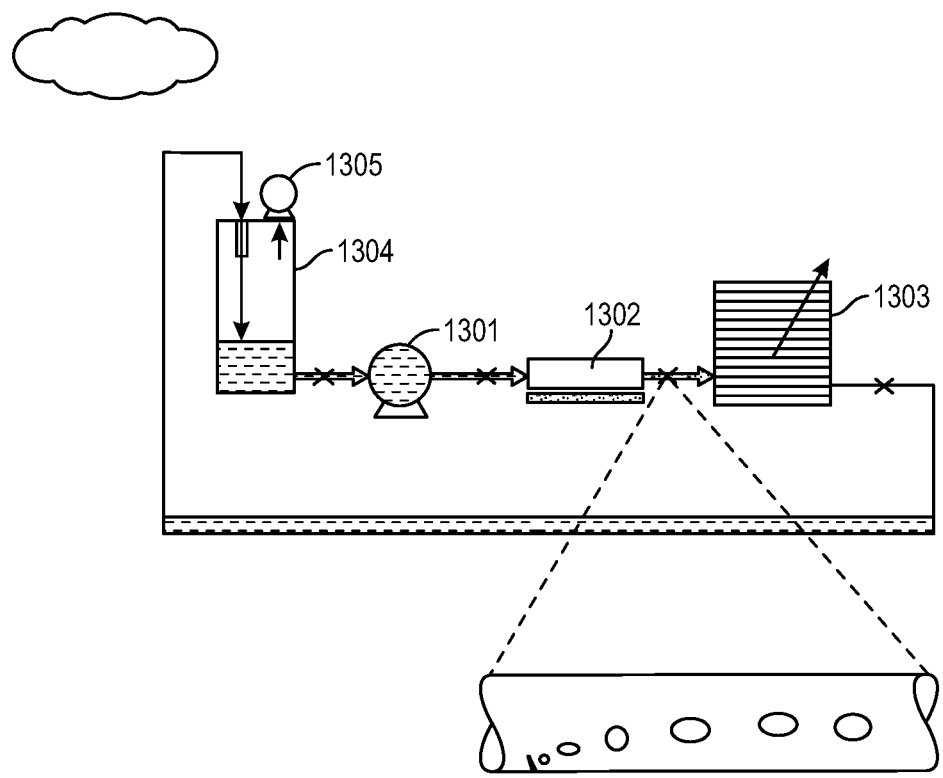
FIGS. 13a and 13b pertain to negative pressure liquid cooling system leak detection technique.
Figure 13B:
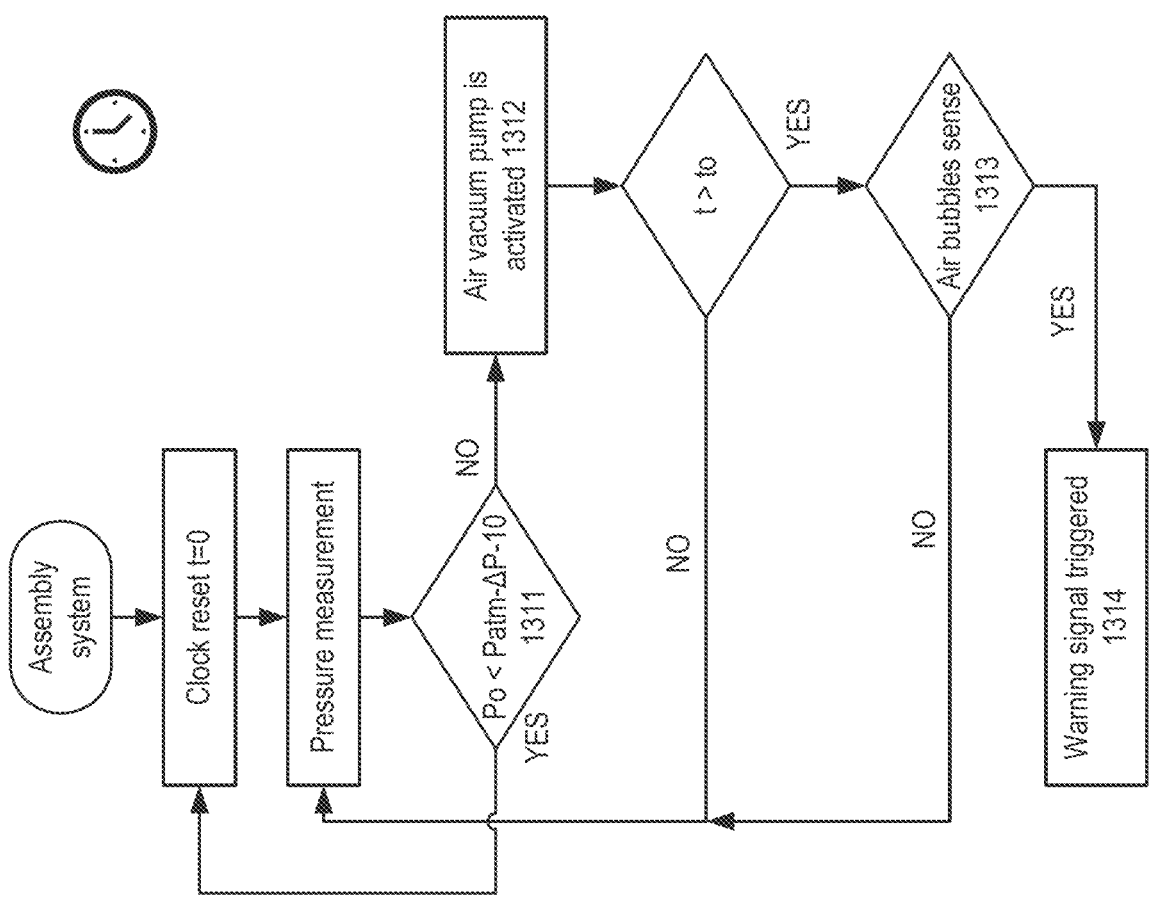

FIGS. 13a and 13b pertain to a leak detection technique for a "negative pressure" liquid cooling system. A negative pressure liquid cooling system purposely maintains the liquid pressure within the system to be less than atmospheric pressure so that if a hole, crack or other opening in the fluidic system appears (which would cause liquid to flow out of the system in a typical liquid cooling system), liquid does not leak from the hole/opening. Rather, because of the pressure difference between the ambient and the system's internal fluid, air bubbles are injected into the cooling system's fluidic conduits.

FIG. 13a shows a model of a negative pressure liquid cooling system 1300. As observed in FIG. 13a, a system pump 1301 pump's cooled liquid coolant through one or more cold plates 1302. Warmed fluid emerges from the cold plate(s) and is directed to a heat exchanger 1303 which cools the liquid. The cooled liquid is then routed to a reservoir 1304 having an air pump 1305. The pump action of the air pump 1305 lowers the internal pressure of the system from the output of the heat exchanger 1303 to the input to the system pump 1301 to something less than atmospheric pressure.

As observed in the exemplary system of FIG. 13a, the air pump 1305 lowers the pressure from the heat exchanger output to the system pump input to 20 kPa whereas the ambient pressure is 101 kPa. The pumping action of the system pump 1301 then raises the internal pressure of the cooled fluid which drives the fluid through the cold plate(s) 1302 and into the heat exchanger 1303. In the exemplary system observed in FIG. 13a, the system pump 1301 raises the fluid pressure to 90 kPa at the system pump output.

Notably, all sections of the closed loop maintain a pressure that is less than atmospheric pressure (20 kPa from heat exchanger to system pump, and, 90 kPa from system pump to heat exchanger). As such, if a hole or other opening develops anywhere in the closed loop, air bubbles will be injected into the system (rather than fluid leaking from the system).

Secondly, during nominal operation, note that there is an 81 kPa difference between ambient pressure and the pressure within the reservoir 1304. That is, during nominal operation, if the ambient maintains a pressure of 101 kPa and the pumping action of the air pump 1305 during initial system bring-up brought the internal pressure of the reservoir down to 20 kPa, the system will maintain a 81 kPa pressure difference between the ambient and the reservoir (note that the air pump need not continuously pump after the reservoir pressure is brought down to its desired level at system bring up (assuming no leaks or ambient pressure changes thereafter)).

However, if a hole or other opening forms in the system, the injection of the air bubbles into the system will have the effect of increasing the pressure within the reservoir 1304. That is, air pressure increases with increasing numbers of air molecules. The injection of air bubbles into the system will result in the air molecules associated with bubbles being injected into the reservoir 1304 thereby raising the air pressure within the reservoir 1304.

Therefore, leaks can be detected by observing any/all of: 1) a change in pressure within the system (e.g., observe an increase in the pressure in the reservoir 1304); 2) a change in a pressure difference within the system (e.g., observe a change in the pressure difference between the system pump output and the heat exchanger output; and/or, 3) air bubbles in the system (e.g., an air bubble detector is located along the conduit piping).

In response to the leak detection, the air pump 1305 is enabled to offset the pressure increase from the air bubbles and maintain less than ambient pressure within the entire system. That is, again, during nominal operation with no leaks the air pump 1305 does not operate. The air pump 1305 is initially put into action during system bring-up to lower the pressures within the system to their nominal, less than ambient values. After the initial bring-up, the air pump 1305 is typically off and pressures are maintained in the system at their nominal levels.

However, after the injection of air bubbles through a newly exposed opening/hole in the system, the system's pressure will increase. In this case, the air pump 1305 is turned on again to offset the pressure increase from the air bubbles and, e.g., maintain the system's pressures to their nominal, less than ambient levels. In this case, however, the air pump maintains 1305 pump activity during operation to continually offset the continuous addition of air molecules into the system from the continuous injection of air bubbles. However, importantly, no liquid emerges from the system and, provided the air pump maintains 1305 pumping action, IT technicians have plenty of time to investigate the problem.

FIG. 13b shows an exemplary alarm raising algorithm that triggers the air pump into action 1312 if a measured pressure differential is not maintained 1311 (the 80 kPa difference between the ambient and the reservoir is not maintained). Upon the air pump being activated if the pressure difference does not return to normal after a set time, the presence of air bubbles within the system is specifically tested for 1313. If air bubbles are detected, an alarm is raised 1314.

4.0 Vapor, Odor and Other Airborne Particulate Leak Detection

Whereas the above described leak detection techniques and/or devices detected the presence of a leaking liquid through the detection of liquid, or, a flow change of some kind, other improvements identify a leak in a liquid cooling system through the detection of a specific vapor, odor or other particulate that becomes airborne as a consequence of coolant leaking from a liquid cooling system. Here, for the sake of generalization, airborne atoms and airborne molecules can be regarded as airborne particulates. As such, gases and vapors can be regarded to include airborne particulates.

In various embodiments, an airborne particulate detector, which as described above can detect any of a specific airborne gas, vapor, smell or other airborne particulate is integrated in some manner within, e.g., a chassis of an electronic system, or, rack or CDU. If the type of airborne particulate that can result from leaking coolant is detected by the particulate detector, an alarm is raised.

Figure 14:
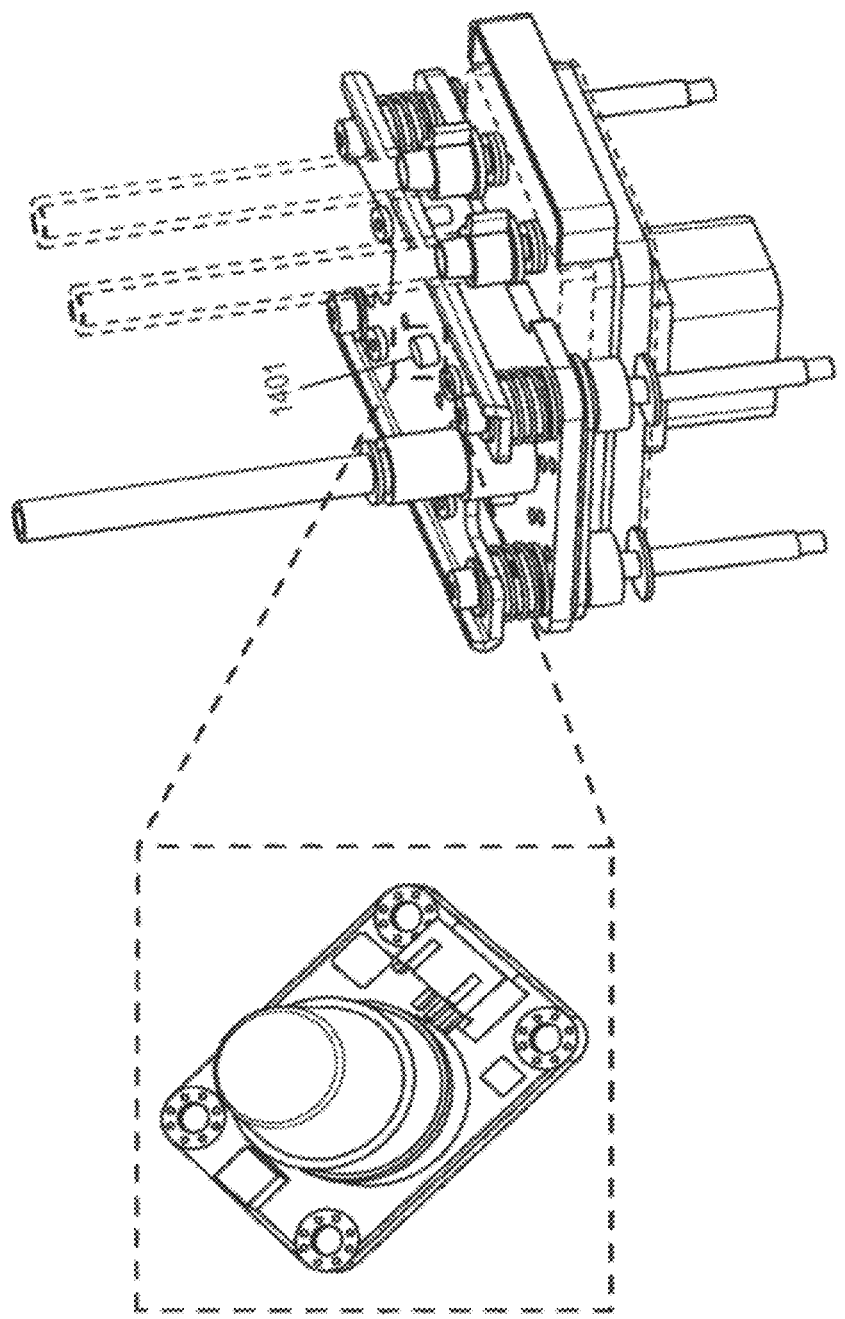
FIG. 14 shows an airborne particulate sensor integrated with a cold plate's fluidic junctions.

Generally, such detectors can be made small enough to fit anywhere within a chassis. FIG. 14, FIGS. 15a,b,c and FIG. 16 show different particulate sensor mechanical integration embodiments.

FIG. 14 shows a first mechanical integration embodiment where airborne particulate sensors 1401 are placed proximate to a weak point or area of the system where leaks are more prone to appear. As discussed above, leaks are more prone at conduit junctions, such as the junction between a conduit tube and a cold plate. As such, FIG. 14 shows the placement of airborne particulate sensors 1401 near a cold plate's junctions with its input/output tubes. Similarly, airborne particulate sensors can be placed on or near other coolant system blocks having one or more fluid junctions (such as manifolds, valves, input ports, output ports, QCQDs, etc.). Such placement allows detection by a particular device to pinpoint which specific component/junction is leaking.

By contrast, FIGS. 15a,b,c (which are re-presentations of FIGS. 7a,b,c) depict embodiments where an airborne particulate sensor 1501 is integrated within a clamshell or sleeve device that is designed to detect a leak at the junction of two tube ends. Here, the clamshell or sleeve can cover a QCQD. If a leak emerges from the QCQD, an airborne particulate is released that the integrated sensor 1501 detects. The sensor then generates an alarm signal.

Figure 16:
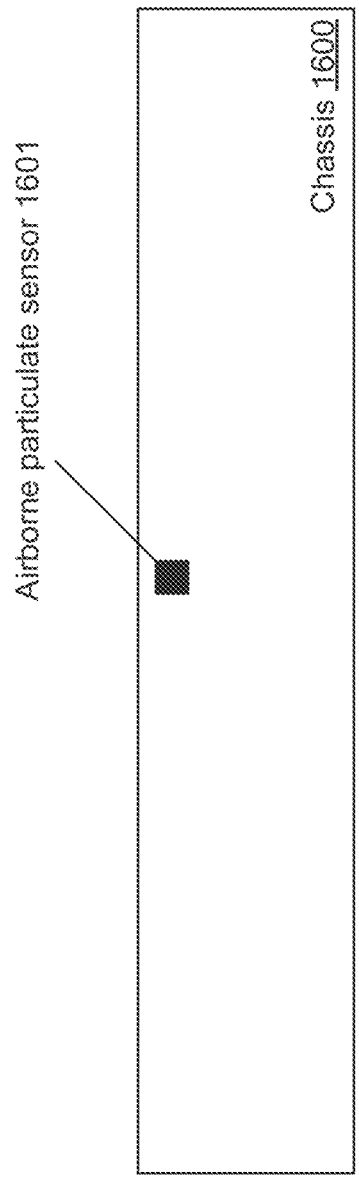
FIG. 16 shows an airborne particulate sensor within a chassis.

FIG. 16 shows that an airborne particulate detector 1601 can be located anywhere in a chassis 1600 and not necessarily near a fluidic junction. Here, if a leak emerges from any of the junctions within the chassis 1600, the detector 1601 will detect the particulate(s) that become airborne within the chassis 1600 as a consequence. Multiple detectors may be dispersed within the chassis to enhance overall detection sensitivity. Communication between the particular detector 1601 and a controller can be wired (e.g., 12C) or wireless (e.g., akin to an RFID device). The controller can be integrated as a component within the chassis. In the case of wireless communication between the detector 1601 and the controller, however, the controller can reside outside the chassis (e.g., as a centralized rack or data center sensor controller).

According to one approach, the airborne particulate sensor 1601 is a humidity detector that detects the presence of airborne liquid molecules (e.g., $H_2O$) in the air. Here, with the coolant being composed of liquid, if the liquid leaks from the system there will be an increase in humidity around the leak and/or in the system which can be detected by the airborne particulate sensor 1601.

In various embodiments, for any of the approaches discussed above with respect to FIGS. 14, 15a,b,c, and 16, an additive is purposely added to the liquid coolant that will generate specific airborne particulates (gases, vapors, odors, etc.) if the coolant leaks from the liquid cooled system. Here, the airborne particulate sensor can be deliberately designed to detect the specific airborne particulate that will be released from the additive. For example, if a specific additive is added to the coolant that will emit a specific odor in the case of a leak, the airborne particulate sensor is specially designed to detect the particular odor.

Here, simple "presence" detectors may be used (that detect whether or not the airborne particulate is present). Alternatively, more complex detectors that quantify how much of the airborne particulate is present can be used (e.g., any of a quart crystal microbalance (QCM) detector, capacitive micromachine ultrasonic transducer (CMUT), or a resonator operating at appropriate frequency/frequencies). Such detectors may be composed of a micro-array where the specific looked for airborne particulate will cause the microarray to yield a specific intensity pattern on the array.

In one embodiment, a QCM or CMUT device/sensor is placed at an output air vent of an electronic system. Here, for instance, referring briefly back to FIG. 12, a QCM or CMUT sensor 1202 is placed at the output air vent and there is no sensor 1201 at the input air vent. Detection of the airborne particulate that the QCM/CMUT sensor is designed to detect at the output air vent signifies a leak within the electronic system.

With respective to additives, according to at least some embodiments, Tetrahydrothiophene (also known as Thiophane (THT)) is mixed into the coolant liquid. Thiophane is generally non-toxic and has a boiling point (e.g., approximately 120° C.) that is higher than the nominal operating temperature of operating semiconductor devices and therefore should not induce boiling within the system under normal circumstances. Nevertheless, from its liquid phase, THT will release a strong odor that is easily detected by a sensor that is designed to detect THT. Humans can also sense THT. Additionally, THT sensors are inexpensive commodity devices.

Another possible additive is fluorocarbon (PFC), fluorinate or fluoroalkane (e.g., to be mixed with glycol water (PGW) as the primary coolant liquid). Fluorocarbon and fluorinate, e.g., having the compound structure $C_xF_y$, will emit a halogen gas if exposed to air during a leak. Halogen detectors, which are commonplace, can be used as the airborne particulate sensors. Like THT, fluorocarbon/fluorinate has a boiling point temperature (e.g., 128° C.) that is higher than the nominal operating temperature of operating semiconductor devices. Fluoroalkane also has potential for use as an additive as well, e.g., if the cooling system components are made of materials that do not react with fluoroalkane.

Generally, although overall coolant thermal conductivity may drop with increasing fluorocarbon/fluorinate/fluoroalkane additive concentrations, the decline is small enough that the resulting coolant mixture can still be used as a coolant (e.g., a mixture of 10% fluorocarbon additive generally results in only a 10% drop in thermal conductivity over a wide range of PGW volume percentages (20% to 80%) within the primary coolant). Maintaining thermal conductivity is relevant because the higher the thermal conductivity of the coolant, the more heat it will pick up from, e.g., a cold plate.

Additional embodiments inject dry air around, e.g. a cold plate or other liquid cooling components to prevent the collection of condensation on the cooling components or any electrical devices. Here, certain electronic systems can be subjected to extremely cold temperatures in the field (e.g., networking equipment that resides outdoors) or during testing. When temperatures become very cold (e.g., below 0° C.), condensation can form, e.g., from ambient moisture and attach to cold, solid masses such a cold plate or other cooling system component.

Figure 17A:
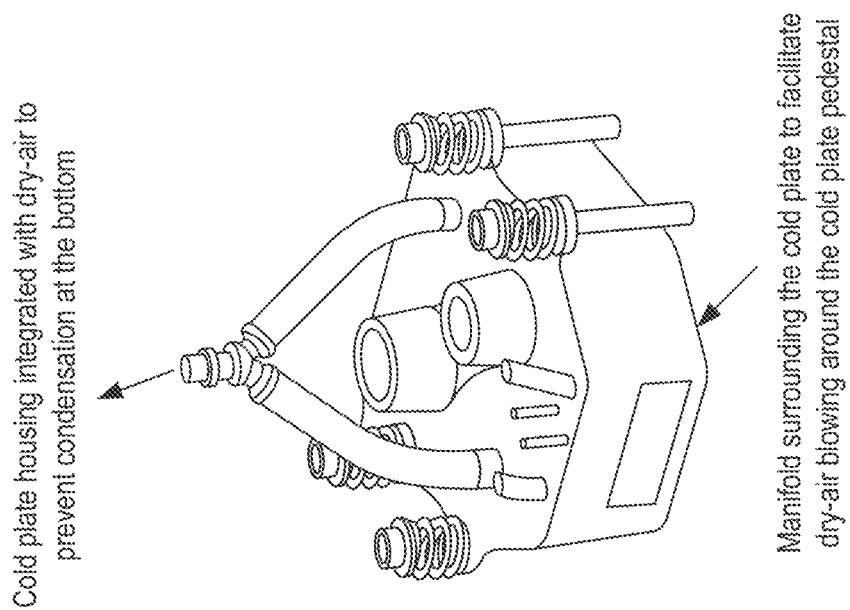
FIGS. 17*a* and 17*b* show a dry air encapsulated cold plate.
Figure 17B:
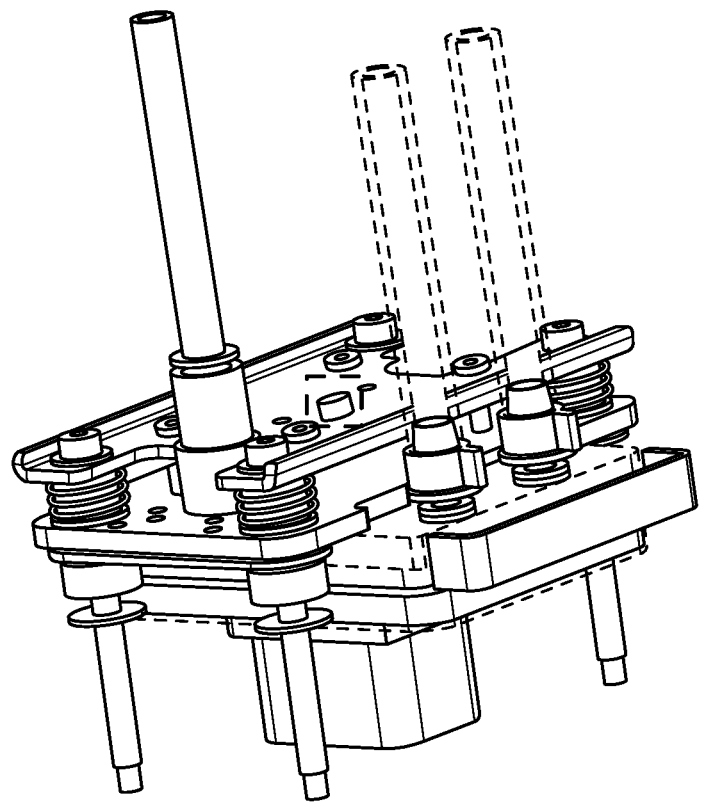

By surrounding such solid masses with dry air, moisture is substantially removed from the ambient resulting in little/no propensity for condensation. FIG. 17a shows a cold plate that is encapsulated within a housing having input and output ports for the dry air. Dry air is injected into the inlet and flows from the outlet so that the cold plate is subjected to a continuous flow of dry air. A dry air source (not shown) can be integrated into a chassis or rack. In the case of the later the chassis has dry air inlets and outlets to receive/emit the dry air flow that is generated by the rack. Any of the leak detecting approaches described above in the preceding sections can be integrated with the dry air encapsulated cold plate of FIG. 17a. FIG. 17b shows an example where an odor sensor, akin to the solution presented in FIG. 14, is placed near the fluid junctions of a dry air encapsulated cold plate.

5.0 Closing Comments

Various solutions above state that a sensor raised an alarm or caused an alarm to be raised. The sensor can send its appropriate detection signal wirelessly or in wired fashion to circuitry that is located proximate to the sensor (e.g., the same chassis) or more remote from the sensor (e.g., sensors in multiple chassis communicate via RFID tags to a centralized controller that is the rack or larger data center). In various embodiments the signals that are sent by a sensor are received by a controller that processes the signal and generates a formal alarm signal as a consequence. Again the controller can be located proximately to the sensor or more remotely from the sensor depending on implementation.

Moreover, generally, any combination of the different approaches described above can be combined together to form a more robust overall liquid cooling system with leak detection.

It is pertinent to point out that any, e.g., high density large scale semiconductor chip or multi-chip package could be disposed on a motherboard and liquid cooled. Examples include processors (CPUs), (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.).

Any chassis discussed above can have dimensions that are compatible with an industry standard rack (such as racks having 19" or 23" widthwise openings and having mounting holes for chassis having heights of specific height units (e.g., 1 U, 2 U, 3 U where U=1.75"). One example is the IEC 60297 Mechanical structures for electronic equipment—Dimensions of mechanical structures of the 482.6 mm (19 in) series. Generally, however, a chassis of any dimension is possible.

The electrical I/Os of the ruler to motherboard connections described above (or input/output interfaces between the rack and chassis described above) may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

The chassis described above may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 18:
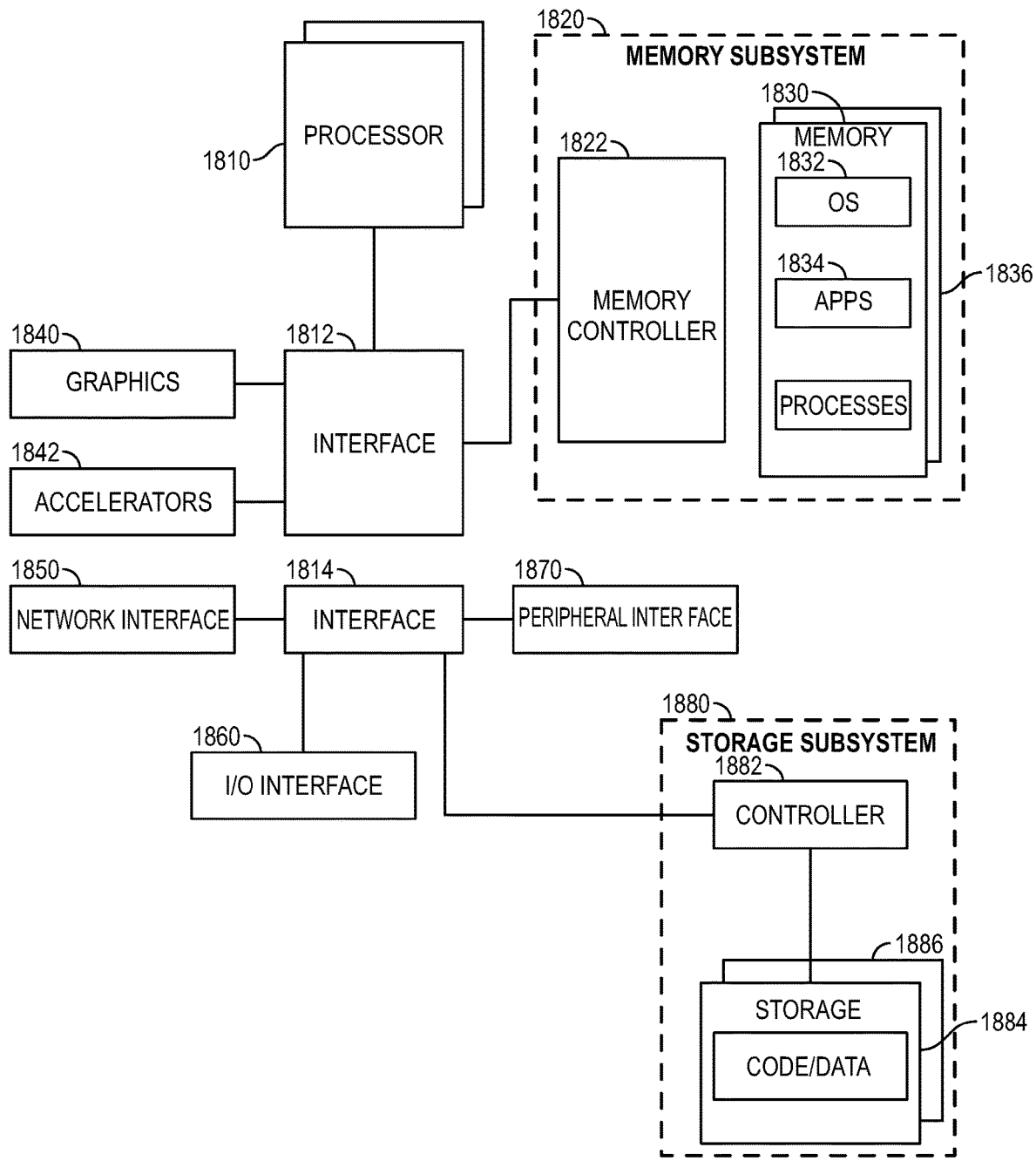
FIG. 18 depicts a computer system.

FIG. 18 depicts an example system. The system can use embodiments described herein to determine a reference voltage to apply to a rank of memory devices and a timing delay of a chip select (CS) signal sent to the rank of memory devices. System 1800 includes processor 1810, which provides processing, operation management, and execution of instructions for system 1800. Processor 1810 can include any type of microprocessor, central processing unit (CPU), graphics processing unit (GPU), processing core, or other processing hardware to provide processing for system 1800, or a combination of processors. Processor 1810 controls the overall operation of system 1800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1800 includes interface 1812 coupled to processor 1810, which can represent a higher speed interface or a high throughput interface for system components that needs higher bandwidth connections, such as memory subsystem 1820 or graphics interface components 1840, or accelerators 1842. Interface 1812 represents an interface circuit, which can be a standalone component or integrated onto a processor die. Where present, graphics interface 1840 interfaces to graphics components for providing a visual display to a user of system 1800. In one example, graphics interface 1840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1840 generates a display based on data stored in memory 1830 or based on operations executed by processor 1810 or both. In one example, graphics interface 1840 generates a display based on data stored in memory 1830 or based on operations executed by processor 1810 or both.

Accelerators 1842 can be a fixed function offload engine that can be accessed or used by a processor 1810. For example, an accelerator among accelerators 1842 can provide compression (DC) capability, cryptography services such as public key encryption (PKE), cipher, hash/authentication capabilities, decryption, or other capabilities or services. In some embodiments, in addition or alternatively, an accelerator among accelerators 1842 provides field select controller capabilities as described herein. In some cases, accelerators 1842 can be integrated into a CPU socket (e.g., a connector to a motherboard or circuit board that includes a CPU and provides an electrical interface with the CPU). For example, accelerators 1842 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 1842 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1820 represents the main memory of system 1800 and provides storage for code to be executed by processor 1810, or data values to be used in executing a routine. Memory subsystem 1820 can include one or more memory devices 1830 such as read-only memory (ROM), flash memory, volatile memory, or a combination of such devices. Memory 1830 stores and hosts, among other things, operating system (OS) 1832 to provide a software platform for execution of instructions in system 1800. Additionally, applications 1834 can execute on the software platform of OS 1832 from memory 1830. Applications 1834 represent programs that have their own operational logic to perform execution of one or more functions. Processes 1836 represent agents or routines that provide auxiliary functions to OS 1832 or one or more applications 1834 or a combination. OS 1832, applications 1834, and processes 1836 provide software logic to provide functions for system 1800. In one example, memory subsystem 1820 includes memory controller 1822, which is a memory controller to generate and issue commands to memory 1830. It will be understood that memory controller 1822 could be a physical part of processor 1810 or a physical part of interface 1812. For example, memory controller 1822 can be an integrated memory controller, integrated onto a circuit with processor 1810. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 1800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 1800 includes interface 1814, which can be coupled to interface 1812. In one example, interface 1814 represents an interface circuit, which can include standalone components and integrated circuitry. In one example, multiple user interface components or peripheral components, or both, couple to interface 1814. Network interface 1850 provides system 1800 the ability to communicate with remote devices (e.g., servers or other computing devices) over one or more networks. Network interface 1850 can include an Ethernet adapter, wireless interconnection components, cellular network interconnection components, USB (universal serial bus), or other wired or wireless standards-based or proprietary interfaces. Network interface 1850 can transmit data to a remote device, which can include sending data stored in memory. Network interface 1850 can receive data from a remote device, which can include storing received data into memory. Various embodiments can be used in connection with network interface 1850, processor 1810, and memory subsystem 1820.

In one example, system 1800 includes one or more input/output (I/O) interface(s) 1860. I/O interface 1860 can include one or more interface components through which a user interacts with system 1800 (e.g., audio, alphanumeric, tactile/touch, or other interfacing). Peripheral interface 1870 can include any hardware interface not specifically mentioned above. Peripherals refer generally to devices that connect dependently to system 1800. A dependent connection is one where system 1800 provides the software platform or hardware platform or both on which operation executes, and with which a user interacts.

In one example, system 1800 includes storage subsystem 1880 to store data in a nonvolatile manner. In one example, in certain system implementations, at least certain components of storage 1880 can overlap with components of memory subsystem 1820. Storage subsystem 1880 includes storage device(s) 1884, which can be or include any conventional medium for storing large amounts of data in a nonvolatile manner, such as one or more magnetic, solid state, or optical based disks, or a combination. Storage 1884 holds code or instructions and data 1886 in a persistent state (e.g., the value is retained despite interruption of power to system 1800). Storage 1884 can be generically considered to be a "memory," although memory 1830 is typically the executing or operating memory to provide instructions to processor 1810. Whereas storage 1884 is nonvolatile, memory 1830 can include volatile memory (e.g., the value or state of the data is indeterminate if power is interrupted to system 1800). In one example, storage subsystem 1880 includes controller 1882 to interface with storage 1884. In one example controller 1882 is a physical part of interface 1814 or processor 1810 or can include circuits or logic in both processor 1810 and interface 1814.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1800. More specifically, power source typically interfaces to one or multiple power supplies in system 2000 to provide power to the components of system 1800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1800 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 19:
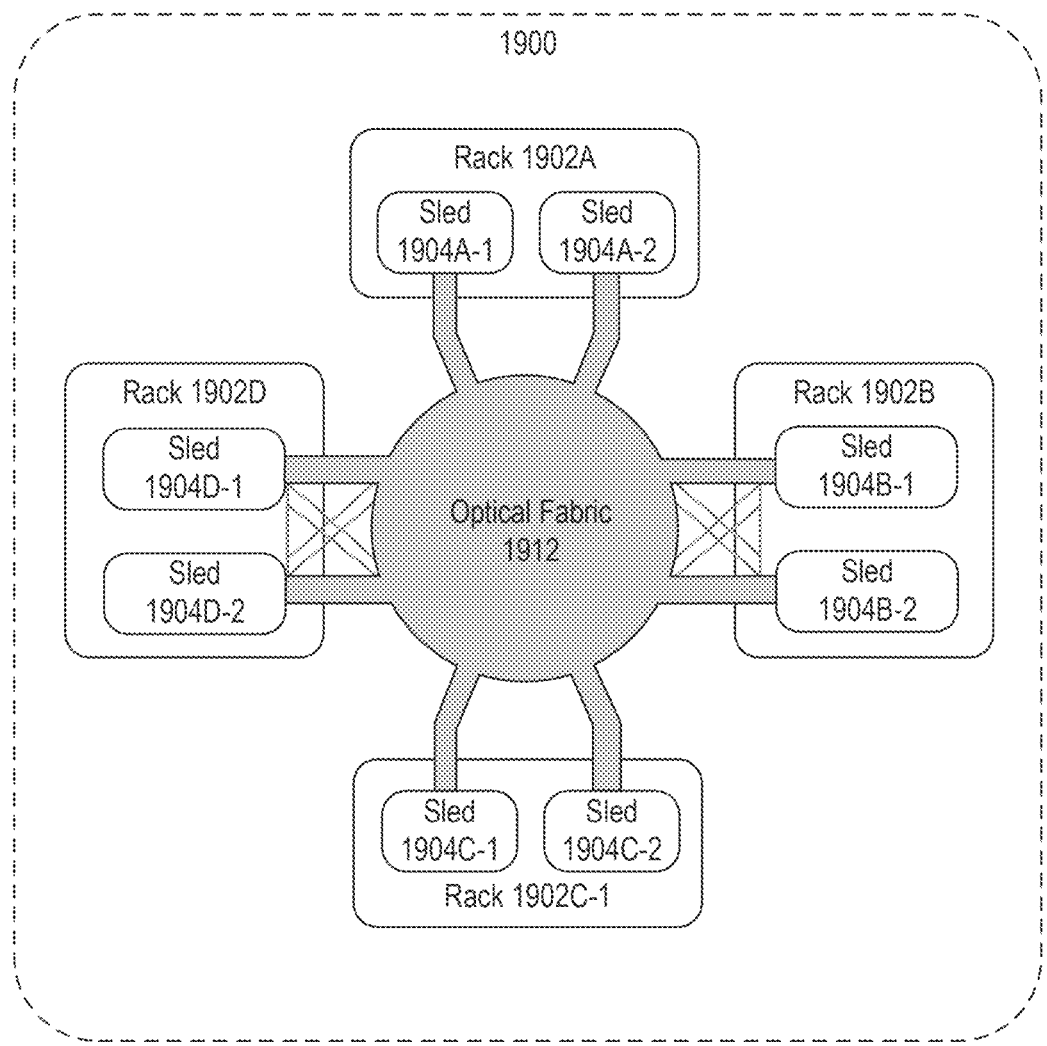
FIG. 19 depicts a data center.

FIG. 19 depicts an example of a data center. Various embodiments can be used in or with the data center of FIG. 19. As shown in FIG. 19, data center 1900 may include an optical fabric 1912. Optical fabric 1912 may generally include a combination of optical signaling media (such as optical cabling) and optical switching infrastructure via which any particular sled in data center 1900 can send signals to (and receive signals from) the other sleds in data center 1900. However, optical, wireless, and/or electrical signals can be transmitted using fabric 1912. The signaling connectivity that optical fabric 1912 provides to any given sled may include connectivity both to other sleds in a same rack and sleds in other racks. Data center 1900 includes four racks 1902A to 1902D and racks 1902A to 1902D house respective pairs of sleds 1904A-1 and 1904A-2, 1904B-1 and 1904B-2, 1904C-1 and 1904C-2, and 1904D-1 and 1904D-2. Thus, in this example, data center 1900 includes a total of eight sleds. Optical fabric 1912 can provide sled signaling connectivity with one or more of the seven other sleds. For example, via optical fabric 1912, sled 1904A-1 in rack 1902A may possess signaling connectivity with sled 1904A-2 in rack 1902A, as well as the six other sleds 1904B-1, 1904B-2, 1904C-1, 1904C-2, 1904D-1, and 1904D-2 that are distributed among the other racks 1902B, 1902C, and 1902D of data center 1900. The embodiments are not limited to this example. For example, fabric 1912 can provide optical and/or electrical signaling.

Figure 20:
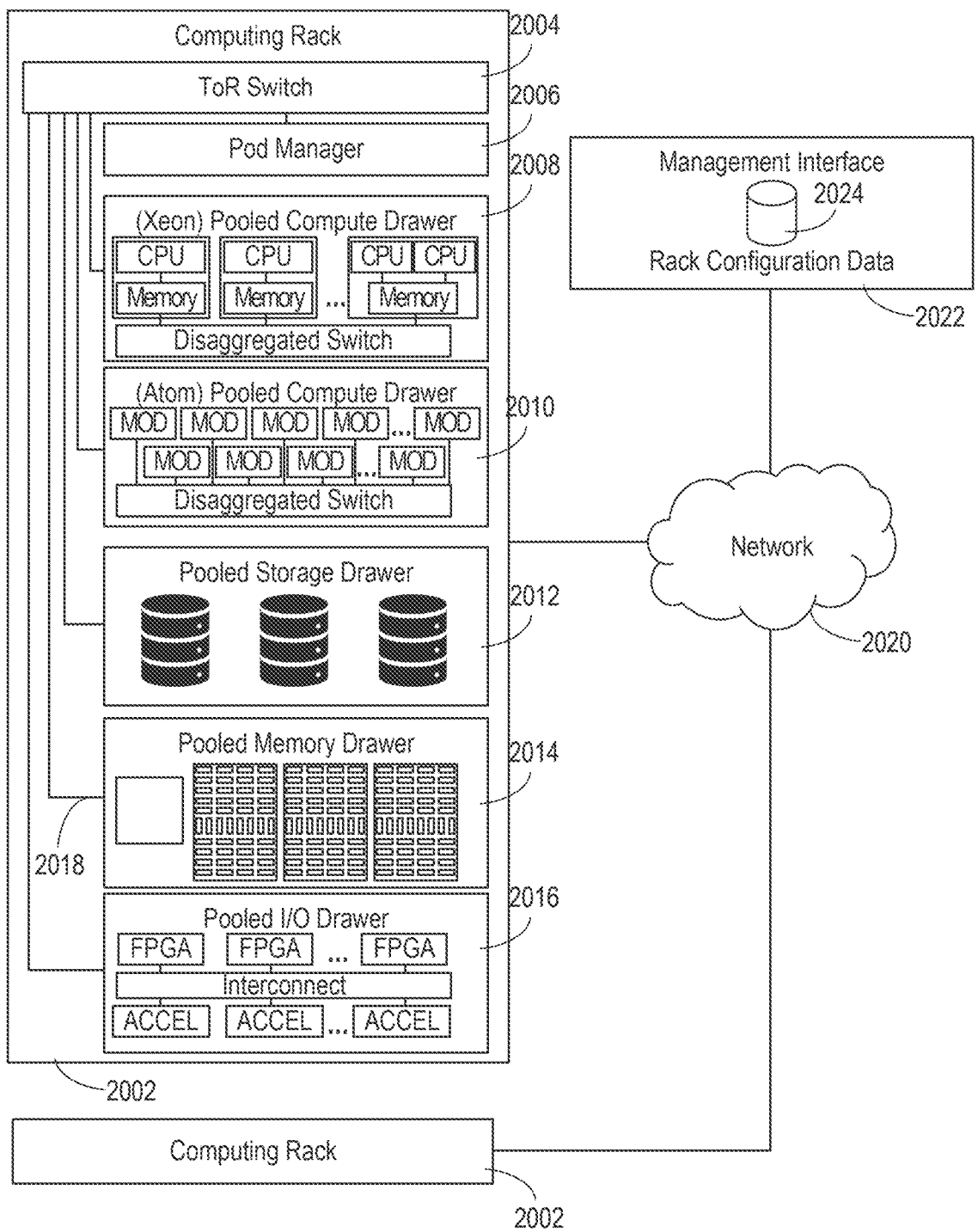
FIG. 20 depicts a rack.

FIG. 20 depicts an environment 2000 includes multiple computing racks 2002, each including a Top of Rack (ToR) switch 2004, a pod manager 2006, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 2008, and INTEL® ATOM™ pooled compute drawer 210, a pooled storage drawer 212, a pooled memory drawer 214, and an pooled I/O drawer 2016. Each of the pooled system drawers is connected to ToR switch 2004 via a high-speed link 2018, such as a 40 Gigabit/second (Gb/s) or 100 Gb/s Ethernet link or an 100+ Gb/s Silicon Photonics (SiPh) optical link. In one embodiment high-speed link 2018 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 2000 may be interconnected via their ToR switches 2004 (e.g., to a pod-level switch or data center switch), as illustrated by connections to a network 2020. In some embodiments, groups of computing racks 2002 are managed as separate pods via pod manager(s) 2006. In one embodiment, a single pod manager is used to manage all of the racks in the pod. Alternatively, distributed pod managers may be used for pod management operations.

RSD environment 2000 further includes a management interface 2022 that is used to manage various aspects of the RSD environment. This includes managing rack configuration, with corresponding parameters stored as rack configuration data 2024.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed:

1. An apparatus, comprising:
   a cover to enclose a junction between respective ends of first and second fluidic conduits, the first and second fluidic conduits to transport a coolant fluid within a cooling system for an electronic device;
   an absorbent layer coupled to a conductive material, the absorbent layer to be located within a region that is enclosed by the cover when the junction is enclosed by the cover, the absorbent layer to absorb leakage of the coolant fluid from the junction and to expand in response to the absorption of the leakage, the conductive material to move when the absorbent layer expands; and an electrical contact spaced apart from the absorbent layer, the conductive material to contact the electrical contact when the absorbent layer expands, the contact between the conductive material and the electrical contact to trigger an alarm signal.

2. The apparatus of claim 1, wherein the cover has a clamshell design.

3. The apparatus of claim 1, wherein the cover is a sleeve.

4. The apparatus of claim 1, wherein the first fluidic conduit is associated with a coolant entrance port or a coolant exit port of a cold plate or a heat exchanger of the cooling system, and further including a liquid detection cable proximate to the coolant entrance port or the coolant exit port.

5. The apparatus of claim 1, further including a cable proximate to the junction, the cable to detect leaked coolant fluid.

6. The apparatus of claim 1, wherein the alarm signal is a first alarm signal, and further including an input coolant flow meter and an output coolant flow meter, a second alarm signal to be output when an output flow measured by the output coolant flow meter falls below an input flow measured by the input coolant flow meter.

7. The apparatus of claim 1, wherein the alarm signal is a first alarm signal, and further including an input air flow humidity meter and an output air flow humidity meter, a second alarm signal to be output when an output air flow humidity measured by the output air flow humidity meter rises above an input air flow humidity measured by the input air flow humidity meter.

8. The apparatus of claim 1, further including a chassis to carry the electronic device and the cooling system.

9. The apparatus of claim 8, further including a touch screen device in the chassis, the touch screen device to detect leaked coolant fluid.

10. The apparatus of claim 8, further including a liquid collection pan along a floor of the chassis to collect leaked coolant fluid.

11. The apparatus of claim 8, wherein the chassis is a first chassis, and further including a second chassis, the second chassis including a negative pressure liquid cooling system, the negative pressure liquid cooling system including an air pump, the air pump to pump air out of the negative pressure liquid cooling system in response to an opening in the negative pressure liquid cooling system.

12. An apparatus comprising:

an airborne particulate sensor;

a cover to enclose a junction between respective ends of first and second fluidic conduits, the first and second fluidic conduits to transport a coolant fluid within a cooling system for an electronic device; and an absorbent layer coupled to a conductive material, the absorbent layer to be located within a region that is enclosed by the cover when the junction is enclosed by the cover, the absorbent layer to absorb leakage of the coolant fluid from the junction and to expand in response to the absorption of the leakage, the conductive material to move when the absorbent layer expands, the movement of the conductive material to trigger an alarm signal.

13. The apparatus of claim 12, wherein the airborne particulate sensor is proximate to the junction or a component of the cooling system.

14. The apparatus of claim 12, wherein the coolant fluid includes an additive, the airborne particulate sensor to detect a particulate of the additive in leaked coolant fluid.

15. The apparatus of claim 14, wherein the additive includes at least one of Thiophane, fluorocarbon (PFC), fluorinate, or fluoroalkane.

* * * * *